(12) United States Patent  
Kamitani

(10) Patent No.: US 6,697,749 B2
(45) Date of Patent: Feb. 24, 2004

(54) CORRECTION METHOD OF MEASUREMENT ERRORS, QUALITY CHECKING METHOD FOR ELECTRONIC COMPONENTS, AND CHARACTERISTIC MEASURING SYSTEM OF ELECTRONIC COMPONENTS

(75) Inventor: Gaku Kamitani, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/306,760

(22) Filed: Nov. 27, 2002

(65) Prior Publication Data

US 2003/0120449 A1 Jun. 26, 2003

(30) Foreign Application Priority Data

Dec. 10, 2001 (JP) ........................................ 2001-375324
Sep. 24, 2002 (JP) ........................................ 2002-277393

(51) Int. Cl.[7] .............................................. G01R 35/00
(52) U.S. Cl. ...................................................... 702/107
(58) Field of Search .......................... 702/85, 90, 107, 702/182; 324/202, 601

(56) References Cited

FOREIGN PATENT DOCUMENTS

JP  815348  1/1996
JP  08-015348  *  1/1996

* cited by examiner

*Primary Examiner*—Michael Nghiem
(74) *Attorney, Agent, or Firm*—Ostrolenk, Faber, Gerb & Soffen, LLP

(57) ABSTRACT

Actual measured results, which do not agree with a reference measuring system accurately, are corrected to the same level as results measured by the reference measuring system. An interrelating formula between results measured by an actual measuring system and results measured by a reference measuring system is obtained after measuring electrical characteristics of a correction-data acquisition sample by the reference measuring system and the actual measuring system, respectively. Then, by substituting electrical characteristics of a target electronic component measured by the actual measuring system in the interrelating formula for computation, the electric characteristics of the target electronic component is corrected to electric characteristics assumed to be obtained by the reference measuring system.

13 Claims, 16 Drawing Sheets

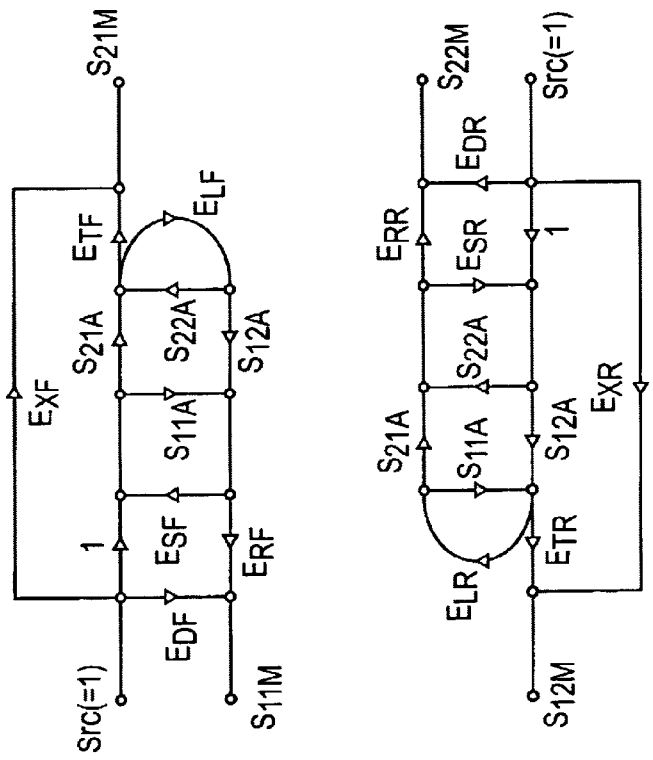

FIG. 7

Src: STIMULUS APPLIED TO MEASUREMENT SYSTEM, SPECIFICALLY SIGNAL SOURCE OUTPUT
SCATTERING COEFFICIENT MEASUREMENT IS SPECIFIC MEASUREMENT SO THAT LET IT BE REFERENCE (1).
S11A, S21A, S12A, S22A: SCATTERING COEFFICIENT OF SAMPLE THAT IS OBTAINED IN NORMAL MEASUREMENT
S11M, S21M, S12M, S22M: OBSERVED VALUE OF SCATTERING COEFFICIENT
$E_{DF}$, $E_{DR}$: DIRECTIONAL ERROR IN FORWARD AND BACKWARD DIRECTIONS
$E_{RF}$, $E_{RR}$: REFLECTION FREQUENCY RESPONSE ERROR IN FORWARD AND BACKWARD DIRECTIONS
$E_{SF}$, $E_{SR}$: SOURCE MATCH IN FORWARD AND BACKWARD DIRECTIONS
$E_{LF}$, $E_{LR}$: LOAD MATCH IN FORWARD AND BACKWARD DIRECTIONS
$E_{TF}$, $E_{TR}$: TRANSMISSION FREQUENCY RESPONSE ERROR IN FORWARD AND BACKWARD DIRECTIONS
$E_{XF}$, $E_{XR}$: LEAK IN FORWARD AND BACKWARD DIRECTIONS

FIG. 13

| NO | CORRECTED SAMPLE RESULTS | | | | MEASURED RESULTS BY ACTUAL MEASURING DEVICE | | | | ELECTRICAL CHARACTERISTIC TRUE VALUES OF TARGET ELECTRONIC COMPONENT | | | | ERROR[%] | | | |
|---|---|---|---|---|---|---|---|---|---|---|---|---|---|---|---|---|
| | $S_{11}*$ | $S_{21}*$ | $S_{12}*$ | $S_{22}*$ | $S_{11M}$ | $S_{21M}$ | $S_{12M}$ | $S_{22M}$ | $S_{11}$ | $S_{21}$ | $S_{12}$ | $S_{22}$ | $E_{11}$ | $E_{21}$ | $E_{12}$ | $E_{22}$ |
| NO.1* | 0.9971 | 0.000864 | 0.000864 | 0.9977 | 0.9967 | 0.000997 | 0.000997 | 0.9974 | 0.9971 | 0.000864 | 0.000864 | 0.9977 | 0.00 | 0.00 | 0.00 | 0.00 |
| NO.2* | -0.9231 | 8.55E-07 | 8.55E-07 | -0.8519 | -0.8519 | 8.82E-07 | 8.62E-07 | -0.7857 | -0.9231 | 8.55E-07 | 8.55E-07 | -0.8519 | 0.00 | 0.00 | 0.00 | 0.00 |
| NO.3 | 0.009409 | 0.000283 | 0.000283 | 0.212 | 0.02851 | 0.000311 | 0.000311 | 0.2241 | 0.009409 | 0.000283 | 0.000283 | 0.212 | 0.00 | 0.00 | 0.00 | 0.00 |
| NO.4 | 0.05575 | 0.9426 | 0.95 | 0.05579 | 0.08991 | 0.9081 | 0.9081 | 0.08998 | 0.05575 | 0.9426 | 0.95 | 0.05579 | 0.00 | 0.00 | 0.00 | 0.00 |
| NO.5 | 0.819055 | 0.086679 | 0.087354 | 0.854497 | 0.8419 | 0.08364 | 0.08364 | 0.8568 | 0.8215 | 0.0841 | 0.0841 | 0.8555 | -0.30 | 3.07 | 3.87 | -0.18 |
| NO.6 | 0.671006 | 0.237068 | 0.238925 | 0.700867 | 0.6799 | 0.2285 | 0.2285 | 0.7089 | 0.6771 | 0.2313 | 0.2313 | 0.7063 | -0.90 | 2.49 | 3.30 | -0.77 |
| NO.7 | 0.440891 | 0.471071 | 0.474766 | 0.461209 | 0.4592 | 0.4539 | 0.4539 | 0.4789 | 0.4493 | 0.4637 | 0.4637 | 0.4693 | -1.87 | 1.59 | 2.39 | -1.72 |
| NO.8 | 0.19628 | 0.719608 | 0.725256 | 0.20644 | 0.2246 | 0.6933 | 0.6933 | 0.2344 | 0.2025 | 0.7154 | 0.7154 | 0.2126 | -3.07 | 0.59 | 1.38 | -2.90 |
| NO.9 | 0.070544 | 0.847407 | 0.854059 | 0.075574 | 0.104 | 0.8164 | 0.8164 | 0.1088 | 0.07375 | 0.8468 | 0.8468 | 0.07862 | -4.35 | 0.07 | 0.86 | -3.87 |
| NO.10 | -0.00245 | 0.023012 | 0.023189 | -0.02268 | 0.006311 | 0.02225 | 0.02225 | 0.0162 | -0.01371 | 0.02313 | 0.02313 | -0.00347 | 151.28 | -0.51 | 0.26 | 553.61 |
| NO.11 | -0.08061 | 0.068827 | 0.069364 | -0.06797 | -0.03825 | 0.06638 | 0.06638 | -0.02752 | -0.06023 | 0.0692 | 0.0692 | -0.04909 | 33.84 | -0.54 | 0.24 | 38.47 |
| NO.12 | -0.17204 | 0.159585 | 0.160836 | -0.15767 | -0.1265 | 0.1538 | 0.1538 | -0.1141 | -0.1529 | 0.161 | 0.161 | -0.14 | 12.52 | -0.88 | -0.10 | 12.52 |
| NO.13 | -0.30991 | 0.296418 | 0.298744 | -0.29286 | -0.2586 | 0.2856 | 0.2856 | -0.2446 | -0.2938 | 0.3005 | 0.3005 | -0.2781 | 5.48 | -1.36 | -0.58 | 5.31 |
| NO.14 | -0.40669 | 0.392554 | 0.395635 | -0.38799 | -0.353 | 0.3782 | 0.3782 | -0.3364 | -0.3364 | 0.3782 | 0.3782 | -0.3761 | 20.90 | 3.80 | -0.94 | 3.16 |

* ERROR 0%

FIG. 14

CORRECTION METHOD OF MEASUREMENT ERRORS, QUALITY CHECKING METHOD FOR ELECTRONIC COMPONENTS, AND CHARACTERISTIC MEASURING SYSTEM OF ELECTRONIC COMPONENTS

BACKGROUND OF THE INVENTION

1. Field of the Invention

The present invention relates to a correction method for correcting electrical characteristics of electronic components measured by an actual measuring system with measured results, which do not agree with a reference measuring system, to electrical characteristics assumed to be obtained by the reference measuring system; a quality checking method using the correction method for electronic components; and a characteristic measuring system for performing the correction method on electronic components.

2. Description of the Related Art

In measuring electrical characteristics of electronic components, sometimes, the same electronic component or the same kind thereof is measured by a plurality of measuring systems, such as a measuring system set up in a site for an electronic component manufacturer and another measuring system set up in a site for a user of the electronic components.

Because measurement errors are different from those in each measuring system in such a case, the precision of measurement reproducibility is low, so that a problem arises from inconsistency of measured results for the same electronic component or the same kind thereof.

Such measurement errors are comparatively low in the electrical characteristic measurement in a low frequency region, so that there is not much problem on this point. Whereas, in a high frequency region of 100 MHz or more, the measurement errors between measuring systems are large, so that in order to improve the precision of measurement reproducibility, calibration using an absolute correction method is performed especially in a high frequency region of several GHz or more.

A standard device is prepared in advance in that an instrument having a target electrical characteristic precisely identified, such as an open/short/load/through, an example of which is the model 85052B manufactured by Agilent Technologies Company. Various measurements of this standard device by each measuring system identify the error factor of each measuring system. Then, the calibration such as a high-accuracy full two-port correction method is performed thereon to eliminate the identified error factor, improving the precision of measurement reproducibility (such a correction method is referred to as an absolute correction method below).

In such a manner, a measuring system can improve the precision of measurement reproducibility by performing the high-accuracy calibration using the standard device mentioned above. However, such calibration can be performed on only an electronic component with a coaxial form (referred to as a coaxial-type electronic component below) so as to measure precisely.

Whereas, the calibration mentioned above has been difficult to perform on an electronic component with a non-coaxial form (referred to as a noncoaxial-type electronic component below). The reason thereof is described below.

A standard device for noncoaxial-type electronic components is extremely difficult to be manufactured to have substantially the same performance as that for coaxial-type electronic components, and manufacturing cost for such a standard device becomes extremely large. Moreover, even if the standard device is manufactured, it is difficult to specify electrical characteristics thereof in high accuracy.

Furthermore, even if a standard device for noncoaxial-type electronic components is prepared, in a measuring system capable of performing the high-accuracy calibration (such as the full two-port correction method), the standard device capable of performing the calibration mentioned above is limited to the instrument to achieve the value (typically, the open/short/load/through), which cannot be achieved unless the component is of a coaxial-type. By such reasons, the calibration mentioned above is difficult to be performed on noncoaxial-type electronic components.

In performing a TRL correction method, a kind of calibration, a standard device (typically, a standard device of a through/reflection/line) for noncoaxial-type electronic components such as waveguides and microstrip lines may be easily manufactured. However, even in the standard device suitable for the TRL correction method, it is difficult to specify electrical characteristics thereof in high accuracy.

As described above, in the measurement of electrical characteristics of noncoaxial-type electronic components, it is difficult to improve measurement accuracy by performing the calibration thereon based on the absolute correction method. Therefore, up to now, in the measurement of electrical characteristics of noncoaxial-type electronic components, the calibration at junction points of the electronic component is not performed but the measurement is performed in a state of being attached to a measurement fixture, as will be described below.

A measurement fixture is prepared, which has coaxial input-output terminals for a measuring system while having noncoaxial input-output terminals for a noncoaxial-type electronic component. This measurement fixture is electrically connected to a piece of coaxial cable, which is connected to input-output terminals of the measuring system. Then, the noncoaxial-type electronic component is mounted on the measuring system so that electrical characteristics of the component are measured. In addition, it is preferable that the calibration such as a full two-port correction method be performed on the coaxial cable connected to the input-output terminals of the measuring system up to the tip end.

In such an electrical characteristic measurement method for noncoaxial-type electronic components using the measurement fixture, calibration cannot be performed by including the measurement fixture. Therefore, the reproducibility of measured results is low. In order to increase the reproducibility of the measured results, the following adjustments of the measuring system are performed.

In this adjustment, one measuring system is regarded as a reference measuring system having a reference measurement fixture and the other is regarded as an actually measuring system having an actual measurement fixture, so that the actual measurement fixture of the actually measuring system is adjusted so as to bring the measured result from the actually measuring system to that from the reference measuring system. Specifically, electrical characteristics of an arbitrary sample (electronic component) are measured by the reference measuring system; electrical characteristics of the same sample are measured by the actually measuring system, and then, the actual measurement fixture is adjusted so that both the measured results are equalized. The adjustment is specifically performed as follows.

The actual measurement fixture is arranged that a coaxial connector to be connected to a measuring system is attached to a printed circuit board having input-output terminals to be connected to a sample, which are disposed at a wiring end-portion on the substrate surface. In the actual measurement fixture structured as above, adjustment is performed as follows. While part of printed wiring on the printed circuit board being cut off, or solder being put on the printed wiring, changes in the measured results are measured, and the treatment is finalized after the same electrical characteristics as those of the measured results in the reference measuring system are obtained.

The measuring method of electrical characteristics of electronic components described above has the following problems for both measurements of coaxial-type electronic components and noncoaxial-type electronic components.

In measuring method of coaxial-type electronic components, although the reference device necessary for the calibration is available, it is expensive, so that there is a problem that the cost of the calibration is increased, and by extension, the cost for measuring electrical characteristics of electronic components is increased.

In measuring method of noncoaxial-type electronic components, because the adjustment method of the actual measurement fixture mentioned above is not theoretically clarified but is depending on skills and hunch and taking a lot of trouble, it is difficult to reproduce the adjustment in high accuracy even to the old hand.

Furthermore, such an adjustment method of the actual measurement fixture is a method only capable of assuring the reproducibility when measuring the sample used in the adjustment, and when another sample is measured, the reproducibility is not always assured, so that it would have to say that the reproducibility be unstable.

SUMMARY OF THE INVENTION

Accordingly, it is a principal object of the present invention to provide a correction method of measurement errors in that measured results of actual measurement, which do not perfectly agree with a reference measuring system, is corrected to the same level of measured results by the reference measuring system.

In order to achieve the object mentioned above, a measurement-error correction method, in which after electrical characteristics of a target electronic component are measured by an actual measuring system with measured results that do not agree with a reference measuring system, the measured value is corrected to electrical characteristics assumed to be obtained by the reference measuring system, the measurement-error correction method comprising the steps of preparing a correction-data acquisition sample in advance, which generates the same electrical characteristics as arbitrary electrical characteristics of the target electronic component by measurement operation; measuring electrical characteristics of the correction-data acquisition sample by the reference measuring system and the actual measuring system, respectively; obtaining an interrelating formula between results measured by the reference measuring system and results measured by the actual measuring system; and correcting electrical characteristics of the target electronic component to electrical characteristics assumed to be obtained by the reference measuring system by substituting the electrical characteristics of the target electronic component measured by the actual measuring system in the interrelating formula for computation. Thereby the following functions are provided.

Based on the measured results of the correction-data acquisition sample with not-identified electrical characteristics, the interrelating formula between the actual measuring system and the reference measuring system is obtained. Then, electrical characteristics of the target electronic component are corrected to the electrical characteristics assumed to be obtained by the reference measuring system on the basis of the interrelating formula, eliminating calibration using an expensive authentic sample and adjustment of measurement fixtures. Moreover, the electrical characteristic correction is performed by theoretical computation, so that repeatability of electrical characteristic measurement of electronic components with any shapes (coaxial or noncoaxial shape) can be increased.

The present invention proposes an analytical relative correction method and an approximate-relative correction method as correction methods using the interrelating formula.

For obtaining the interrelation equation by the analytical relative correction method, the present invention may comprise the procedures of creating a theoretical equation for obtaining a measurement true value of the actual measuring system in the signal transfer pattern and a theoretical equation for obtaining a measurement true value of the reference measuring system in the signal transfer pattern, respectively; creating the interrelating formula comprising an arithmetic expression, which includes an undetermined coefficient and directly and exclusively shows the relationship between the measurement true value of the actual measuring system and the measurement true value of the reference measuring system, based on both the theoretical equations; measuring electrical characteristics of the correction-data acquisition sample by the reference measuring system and the actual measuring system, respectively; and identifying the undetermined coefficient by substituting the electrical characteristics of the correction-data acquisition sample measured by both the measuring systems in the interrelating formula.

For obtaining the interrelation equation by the approximate-relative correction method, the present invention may comprise the procedures of creating the interrelating formula comprising an expression of degree n (n is a natural number) including an undetermined coefficient and approximately showing the relationship between the value measured by the actual measuring system and the value measured by the reference measuring system, measuring electrical characteristics of the correction-data acquisition sample by the reference measuring system and the actual measuring system, respectively, and identifying the undetermined coefficient by creating an undetermined-coefficient computing equation based on the interrelating formula so as to substitute the electrical characteristics of the correction-data acquisition sample measured by both the measuring systems in the undetermined-coefficient computing equation.

Preferably, measurement-error correction is performed on a plurality of electrical characteristics which are included in the target electronic component. In this connection, a plurality of samples having electrical characteristics which are different from each other as measured by the measuring system are used as the correction-data acquisition sample. Thereby, accuracy of correction by the interrelation equation is further improved. Moreover, it is enough to prepare the correction-data acquisition samples having arbitrary electrical characteristics without identifying a physical true value of the characteristics, simplifying manufacturing or availability.

Preferably, a characteristic of measurement-error correction is an S parameter and a measuring instrument constituting the measuring system is a network analyzer.

Examples of the S parameter may be a reflection coefficient in a forward direction, transfer coefficient in the forward direction, reflection coefficient in a backward direction, and transfer coefficient in the backward direction.

Specific procedures of creating the interrelating formula by the approximate-relative correction method are shown as follows.

The method for creating the interrelating formula comprises the steps of:

creating the following interrelating formula (B2) comprising a linear expression and the following undetermined coefficient computing equations (B1a) to (B1d);

preparing five correction-data acquisition samples with electrical characteristics, which are generated by measurement operation of the measuring system and being different from each other, and then measuring S parameter ($S_{11}^n$, $S_{21}^n$, $S_{12}^n$, and $S_{22}^n$: n: natural numbers of 1 to 5) of the correction-data acquisition samples by the reference measuring system and the actual measuring system;

determining undetermined coefficients ($a_m$, $b_m$, $c_m$, and $d_m$: m; integers of 0 to 4) by substituting the measured S parameter ($S_{11}^n$, $S_{21}^n$, $S_{12}^n$, and $S_{22}^n$) in the undetermined coefficient computing equations (B1a) to (B1d); and inserting the identified undetermined coefficients ($a_m$, $b_m$, $c_m$, and $d_m$) into the interrelating formula (B2).

[Numerical Formula 1]

$$\begin{pmatrix} S_{11}^{1*} \\ S_{11}^{2*} \\ S_{11}^{3*} \\ S_{11}^{4*} \\ S_{11}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} a_1 \\ a_2 \\ a_3 \\ a_4 \\ a_0 \end{pmatrix} \quad B1a$$

$$\begin{pmatrix} S_{21}^{1*} \\ S_{21}^{2*} \\ S_{21}^{3*} \\ S_{21}^{4*} \\ S_{21}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} b_1 \\ b_2 \\ b_3 \\ b_4 \\ b_0 \end{pmatrix} \quad B1b$$

$$\begin{pmatrix} S_{12}^{1*} \\ S_{12}^{2*} \\ S_{12}^{3*} \\ S_{12}^{4*} \\ S_{12}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} c_1 \\ c_2 \\ c_3 \\ c_4 \\ c_0 \end{pmatrix} \quad B1c$$

-continued $$\begin{pmatrix} S_{22}^{1*} \\ S_{22}^{2*} \\ S_{22}^{3*} \\ S_{22}^{4*} \\ S_{22}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} d_1 \\ d_2 \\ d_3 \\ d_4 \\ d_0 \end{pmatrix} \quad B1d$$

$S_{11}^{n*}$, $S_{21}^{n*}$, $S_{12}^{n*}$, and $S_{22}^{n*}$: the S parameter of the correction-data acquisition samples measured by the reference measuring system $S_{11}^{nM}$, $S_{21}^{nM}$, $S_{12}^{nm}$, and $S_{22}^{nM}$: the S parameter of the correction-data acquisition samples measured by the actual measuring system

[Numerical Formula 2]

$$\begin{pmatrix} S_{11}^* \\ S_{21}^* \\ S_{12}^* \\ S_{22}^* \end{pmatrix} = \begin{pmatrix} a_1 & a_2 & a_3 & a_4 \\ b_1 & b_2 & b_3 & b_4 \\ c_1 & c_2 & c_3 & c_4 \\ d_1 & d_2 & d_3 & d_4 \end{pmatrix} \begin{pmatrix} S_{11}^M \\ S_{21}^M \\ S_{12}^M \\ S_{22}^M \end{pmatrix} + \begin{pmatrix} a_0 \\ b_0 \\ c_0 \\ d_0 \end{pmatrix} \quad B2$$

$S_{11}^*$, $S_{21}^*$, $S_{12}^*$, and $S_{22}^*$: the S parameter of the target electronic component assumed to be obtained by the reference measuring system $S_{11}^M$, $S_{21}^M$, $S_{12}^M$, and $S_{22}^M$: the S parameter of the target electronic component measured by the actual measuring system Other specific procedures of creating the interrelating formula by the approximate-relative correction method are further shown as follows.

The method for creating the interrelating formula comprises the steps of:

creating the following interrelating formulas (C2a) to (C2d) comprising a quadratic expression and the following undetermined coefficient computing equations (C1a) to (C1d);

preparing 15 correction-data acquisition samples with electrical characteristics, which are generated by measurement operation and being different from each other, and then measuring S parameter ($S_{11}^p$, $S_{21}^p$, $S_{12}^p$, and $S_{22}^p$: p: natural numbers of 1 to 15) of the correction-data acquisition samples by the reference measuring system and the actual measuring system;

determining undetermined coefficients ($a_q$, $b_q$, $c_q$, and $d_q$: q; integers of 0 to 14) by substituting the measured S parameter ($S_{11}^p$, $S_{21}^p$, $S_{12}^p$, and $S_{22}^p$) in the undetermined coefficient computing equations (C1a) to (C1d); and inserting the identified undetermined coefficients ($a_q$, $b_q$, $c_q$, and $d_q$) into the interrelating formulas (C2a) to (C2d).

[Numerical Formula 3]

$$\begin{pmatrix} s_{11}^{1*} \\ s_{11}^{2*} \\ s_{11}^{3*} \\ s_{11}^{4*} \\ s_{11}^{5*} \\ s_{11}^{6*} \\ s_{11}^{7*} \\ s_{11}^{8*} \\ s_{11}^{9*} \\ s_{11}^{10*} \\ s_{11}^{11*} \\ s_{11}^{12*} \\ s_{11}^{13*} \\ s_{11}^{14*} \\ s_{11}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \underbrace{\begin{pmatrix} a_1 \\ a_2 \\ a_3 \\ a_4 \\ a_5 \\ a_6 \\ a_7 \\ a_8 \\ a_9 \\ a_{10} \\ a_{11} \\ a_{12} \\ a_{13} \\ a_{14} \\ a_0 \end{pmatrix}}_{C1a}$$

[Numerical Formula 4]

$$\begin{pmatrix} s_{21}^{1*} \\ s_{21}^{2*} \\ s_{21}^{3*} \\ s_{21}^{4*} \\ s_{21}^{5*} \\ s_{21}^{6*} \\ s_{21}^{7*} \\ s_{21}^{8*} \\ s_{21}^{9*} \\ s_{21}^{10*} \\ s_{21}^{11*} \\ s_{21}^{12*} \\ s_{21}^{13*} \\ s_{21}^{14*} \\ s_{21}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \underbrace{\begin{pmatrix} b_1 \\ b_2 \\ b_3 \\ b_4 \\ b_5 \\ b_6 \\ b_7 \\ b_8 \\ b_9 \\ b_{10} \\ b_{11} \\ b_{12} \\ b_{13} \\ b_{14} \\ b_0 \end{pmatrix}}_{C1b}$$

[Numerical Formula 5]

$$\begin{pmatrix} s_{12}^{1*} \\ s_{12}^{2*} \\ s_{12}^{3*} \\ s_{12}^{4*} \\ s_{12}^{5*} \\ s_{12}^{6*} \\ s_{12}^{7*} \\ s_{12}^{8*} \\ s_{12}^{9*} \\ s_{12}^{10*} \\ s_{12}^{11*} \\ s_{12}^{12*} \\ s_{12}^{13*} \\ s_{12}^{14*} \\ s_{12}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \begin{Bmatrix} c_1 \\ c_2 \\ c_3 \\ c_4 \\ c_5 \\ c_6 \\ c_7 \\ c_8 \\ c_9 \\ c_{10} \\ c_{11} \\ c_{12} \\ c_{13} \\ c_{14} \\ c_0 \end{Bmatrix} \quad C1c$$

[Numerical Formula 6]

$$\begin{pmatrix} s_{22}^{1*} \\ s_{22}^{2*} \\ s_{22}^{3*} \\ s_{22}^{4*} \\ s_{22}^{5*} \\ s_{22}^{6*} \\ s_{22}^{7*} \\ s_{22}^{8*} \\ s_{22}^{9*} \\ s_{22}^{10*} \\ s_{22}^{11*} \\ s_{22}^{12*} \\ s_{22}^{13*} \\ s_{22}^{14*} \\ s_{22}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \begin{Bmatrix} d_1 \\ d_2 \\ d_3 \\ d_4 \\ d_5 \\ d_6 \\ d_7 \\ d_8 \\ d_9 \\ d_{10} \\ d_{11} \\ d_{12} \\ d_{13} \\ d_{14} \\ d_0 \end{Bmatrix} \quad C1d$$

$S_{11}^{P*}$, $S_{21}^{P*}$, $S_{12}^{P*}$, and $S_{22}^{P*}$: the S parameter of the correction-data acquisition samples measured by the reference measuring system $S_{11}^{PM}$, $S_{21}^{PM}$, $S_{12}^{PM}$, and $S_{22}^{PM}$: the S parameter of the correction-data acquisition samples measured by the actual measuring system

[Numerical Formula 7]

$$S_{11}^* = \begin{pmatrix} a_1 & a_2 & a_3 & a_4 & a_5 & a_6 & a_7 & a_8 & a_9 & a_{10} & a_{11} & a_{12} & a_{13} & a_{14} & a_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad C2a$$

[Numerical Formula 8]

$$S_{21}^* = \begin{pmatrix} b_1 & b_2 & b_3 & b_4 & b_5 & b_6 & b_7 & b_8 & b_9 & b_{10} & b_{11} & b_{12} & b_{13} & b_{14} & b_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad C2b$$

-continued

[Numerical Formula 9]

$$S_{12}^* = \begin{pmatrix} c_1 & c_2 & c_3 & c_4 & c_5 & c_6 & c_7 & c_8 & c_9 & c_{10} & c_{11} & c_{12} & c_{13} & c_{14} & c_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad C2c$$

[Numerical Formula 10]

$$S_{22}^* = \begin{pmatrix} d_1 & d_2 & d_3 & d_4 & d_5 & d_6 & d_7 & d_8 & d_9 & d_{10} & d_{11} & d_{12} & d_{13} & d_{14} & d_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad C2d$$

$S_{11}^*$, $S_{21}^*$, $S_{12}^*$, and $S_{22}^*$: the S parameter of the target electronic component assumed to be obtained by the reference measuring system $S_{11}^M$, $S_{21}^M$, $S_{12}^M$, and $S_{22}^M$: the S parameter of the target electronic component measured by the actual measuring system The measurement error correction method according to the present invention may be perfectly applied to the quality checking method of electronic components. In this case, in the quality checking method of to electronic components, a target electronic component with required electrical characteristics to be measured by a reference measuring system is measured by an actual measuring system with a measured result not agreeing with that measured by the reference measuring system so as to check quality based on the measured result.

In the checking method according to the present invention, the electrical characteristics of the target electronic component measured by the actual measuring system are corrected using the measurement error correction method according to the present invention, and then, the target electronic component may be checked by comparing the corrected electrical characteristics with the required electrical characteristics. Thereby, quality of the target electronic component can be checked with high accuracy.

According to the present invention, the following electronic component characteristic measuring system may be proposed as a measuring system capable of performing the measurement error correction method described above.

A measuring system of electronic component characteristics comprises measuring means for measuring electrical characteristics of a target electronic component, measured results of the measuring means do not agree with a reference measuring system; storing means for storing electrical characteristics, which are measured by the reference measuring system, of a correction-data acquisition sample generating the same electrical characteristics as arbitrary electrical characteristics of the target electronic component; interrelating formula computing means for computing an interrelating formula between the electrical characteristics of the correction-data acquisition sample, which are measured by the measuring means, and the electrical characteristics of the correction-data acquisition sample, which are measured by the reference measuring system and stored in the storing means; and correcting means for correcting the electrical characteristics of the target electronic component to electrical characteristics assumed to be obtained by the reference measuring system by substituting the electrical characteristics of the target electronic component measured by the measuring means in the interrelating formula for computation.

When the measuring system according to the present invention is configured based on the analytical relative correction method, the interrelating formula computing means may preferably comprise assuming means for assuming signal transfer patterns of both the measuring systems during measurement to include measurement error factors; creating means for creating a theoretical equation for obtaining a measurement true value of the actual measuring system in the signal transfer pattern and creating a theoretical equation for obtaining a measurement true value of the reference measuring system in the signal transfer pattern; creating means for creating the interrelating formula comprising an arithmetic expression, which includes an undetermined coefficient and directly and exclusively shows the relationship between the measurement true value of the actual measuring system and the measurement true value of the reference measuring system, based on both the theoretical equations; measuring means for measuring electrical characteristics of the correction-data acquisition sample by the reference measuring system and the actual measuring system, respectively; and identifying means for identifying the undetermined coefficient by substituting the electrical characteristics of the correction-data acquisition sample measured by both the measuring systems in the interrelating formula.

When the measuring system according to the present invention is configured based on the approximate relative correction method, the interrelating formula computing means may preferably comprise creating means for creating the interrelating formula comprising an expression of degree n (n is a natural number), which includes an undetermined coefficient and approximately shows the relationship between the value measured by the actual measuring system and the value measured by the reference measuring system; measuring means for measuring electrical characteristics of the correction-data acquisition sample by the reference measuring system and the actual measuring system, respectively; and identifying means for identifying the undetermined coefficient by substituting the electrical characteristics of the correction-data acquisition sample measured by both the measuring systems in the interrelating formula.

According to the present invention, in correcting results measured by the actual measuring system to results measured by the reference measuring system, the correction is performed not by a conventional absolute correction method but by the relative correction method. The relative correction method is a method as follows.

The relative correction method is a method for correcting the electric characteristics (sample true value+measurement errors of the actual measuring system) of a target electronic component measured by the actual measuring system (including actual measurement fixture) to the electric characteristics (sample true value+measurement errors of the reference measuring system) assumed to be obtained by the reference measuring system (including reference measurement fixture). The relative correction method has a feature that the sample true value of a target electronic component is not limited to be known but may be unknown.

The present invention proposes the analytical relative correction method and the approximate relative correction method as a relative correction method. During correction by the analytical relative correction method, a signal transfer pattern including measurement error factors of both the measuring systems should be assumed. In this case, the signal transfer pattern may enough correspond to the measurement error factor, so that it is assumed to be arbitrary one. For such a signal transfer pattern, conventional ones used in the absolute correction method may be employed. The analytical relative correction method can correct the entire linear errors with high accuracy in principle. However, the analytical relative correction method cannot correct nonlinear errors. Such features of the analytical relative correction method are the same as those of the absolute correction method.

The approximate relative correction method is a correction method using an approximate equation instead of the analytical equation when the analytical equation becomes too complicated. In the approximate relative correction method, additional errors cannot be avoided because approximate accuracy of the approximate equation absolutely has the limit. However, the number of the correction-data acquisition samples can be reduced in the approximate relative correction method. Also, it can correct nonlinear errors.

As described above, according to the present invention, measured results, which do not agree with the reference measuring system accurately, can be corrected equally to the results measured by the reference measuring system.

Other features and advantages of the present invention will become apparent from the following description of the invention which refers to the accompanying drawings.

BRIEF DESCRIPTION OF THE DRAWINGS

FIG. 7 is a drawing of an example of a signal transfer pattern (error model) for use in performing a measurement error correction method according to a first embodiment of the present invention;

FIG. 13 is a table showing correction data obtained by performing the measurement error correction method according to the second embodiment of the present invention;

FIG. 14 is a table showing correction data obtained by performing a measurement error correction method according to a third embodiment of the present invention;

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

DESCRIPTION OF THE PREFERRED EMBODIMENTS

First Embodiment

According to a first embodiment, the present invention is incorporated in a correction method of measurement errors when electrical characteristics of a surface-mount SAW (surface acoustic wave) filter, which is an electronic component targeted for measurement, are measured by a measuring system having a network analyzer.

Figure 1:
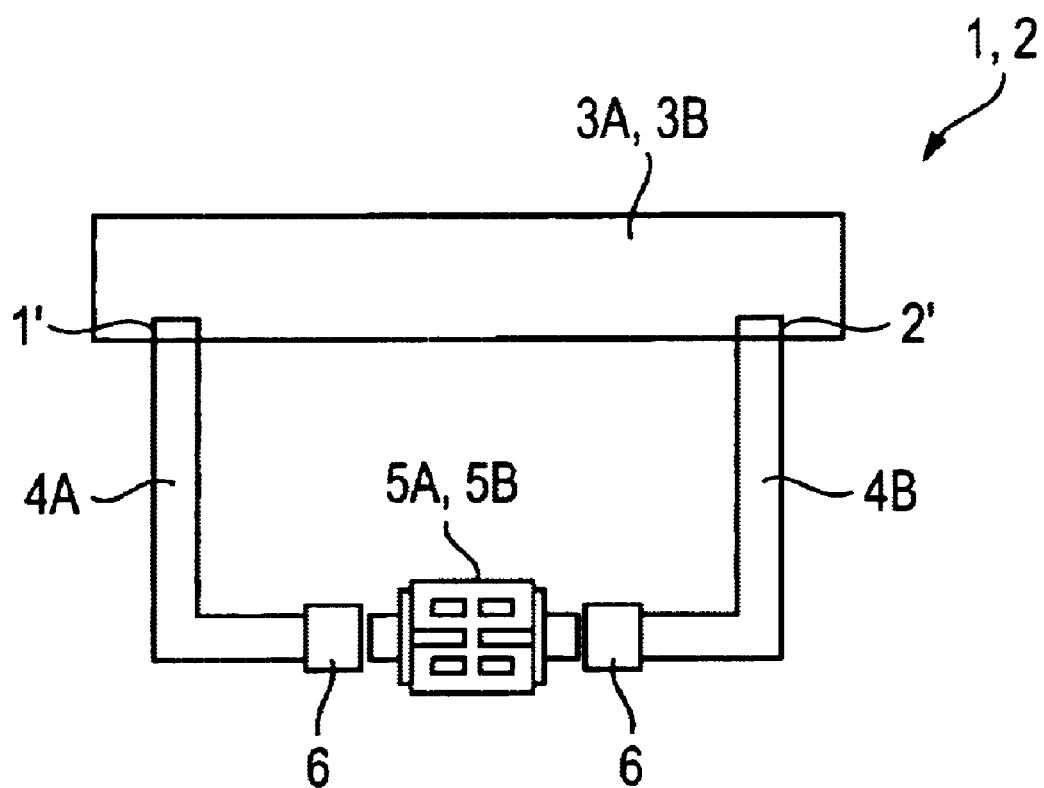
FIG. 1 is a plan view showing an outlined arrangement of a measuring system for performing a measurement error correction method according to the present invention.
Figure 2:
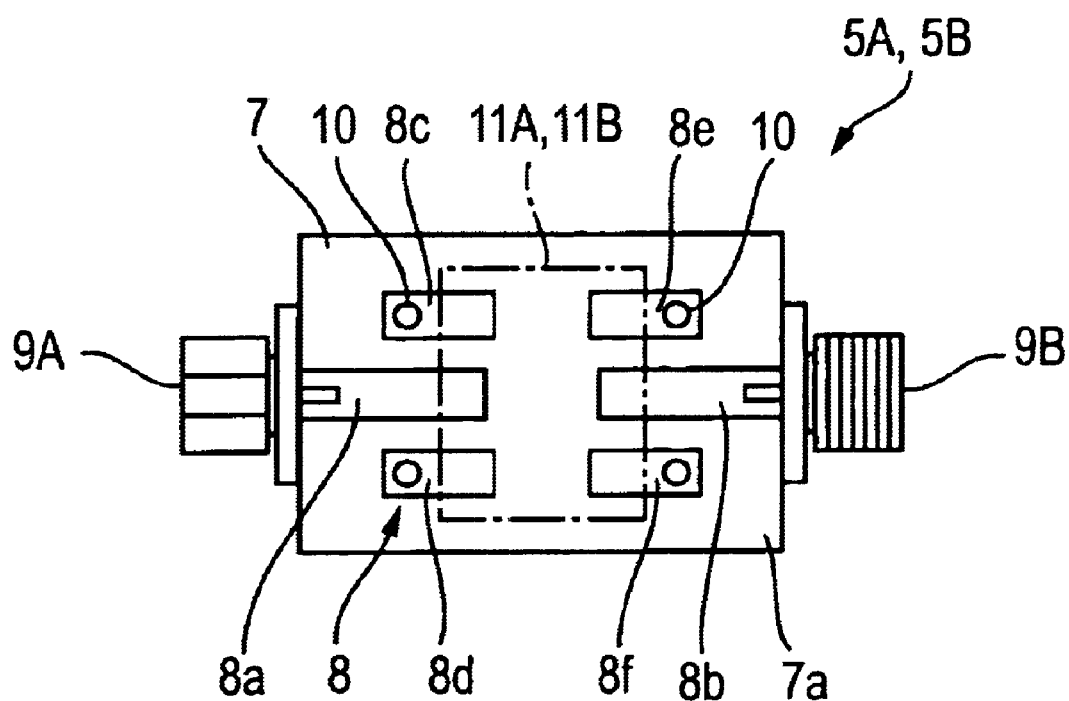
FIG. 2 is a plan view showing an arrangement of a measurement fixture for performing the measurement error correction method according to the present invention.
Figure 3:
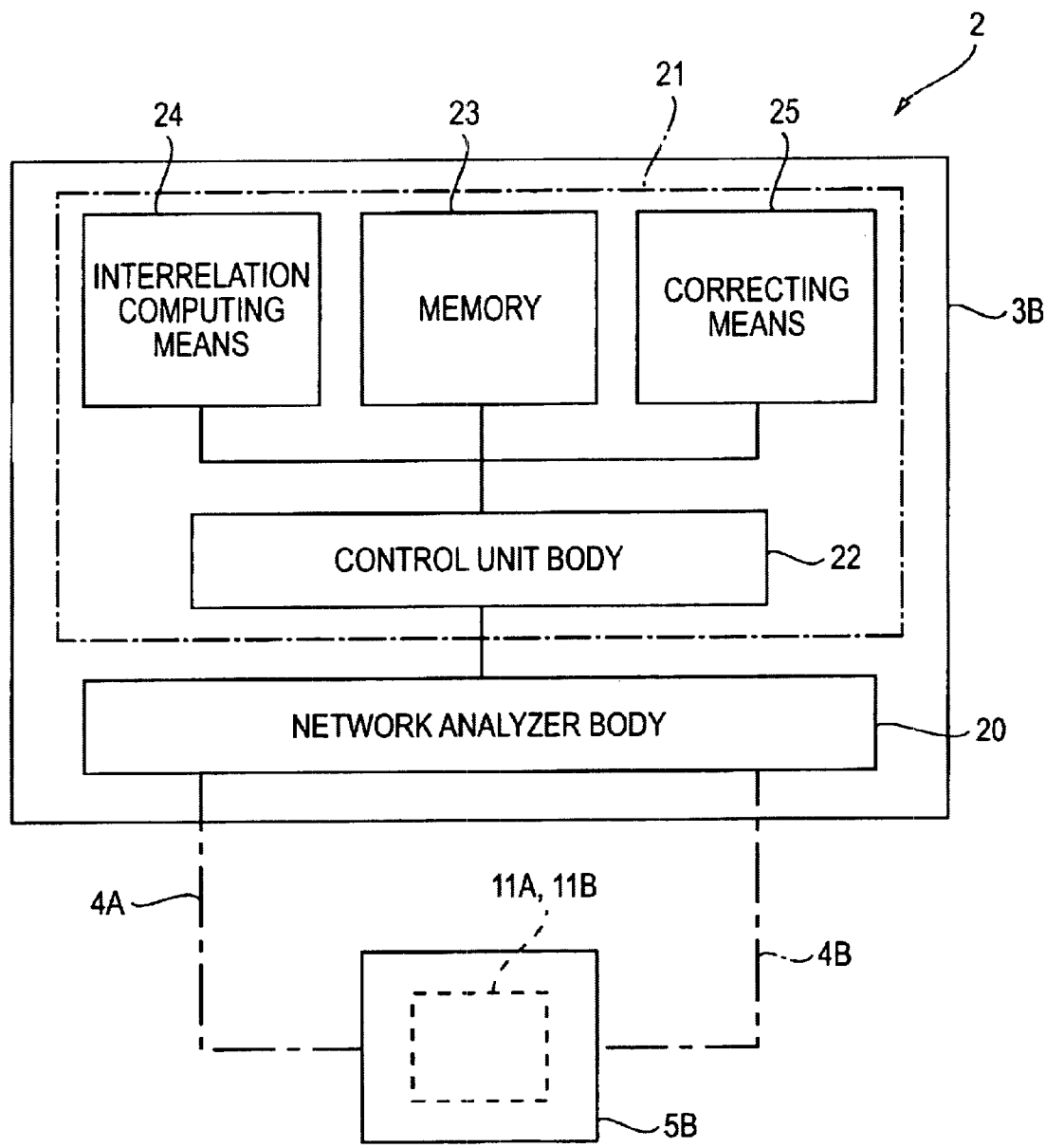
FIG. 3 is a block diagram showing a configuration of the measuring system for performing the measurement error correction method according to the present invention.
Figure 4:
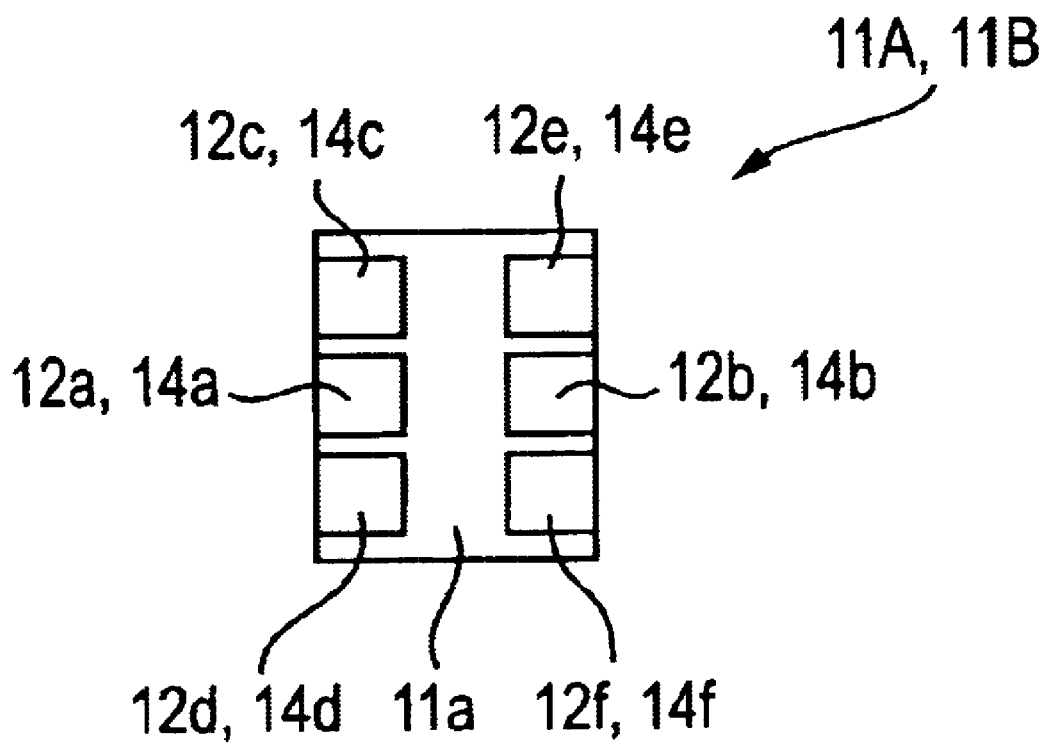
FIG. 4 is a back view showing an arrangement of a correction-data acquisition sample and a target electronic component constituting the measuring system for performing the measurement error correction method according to the present invention.
Figure 5:
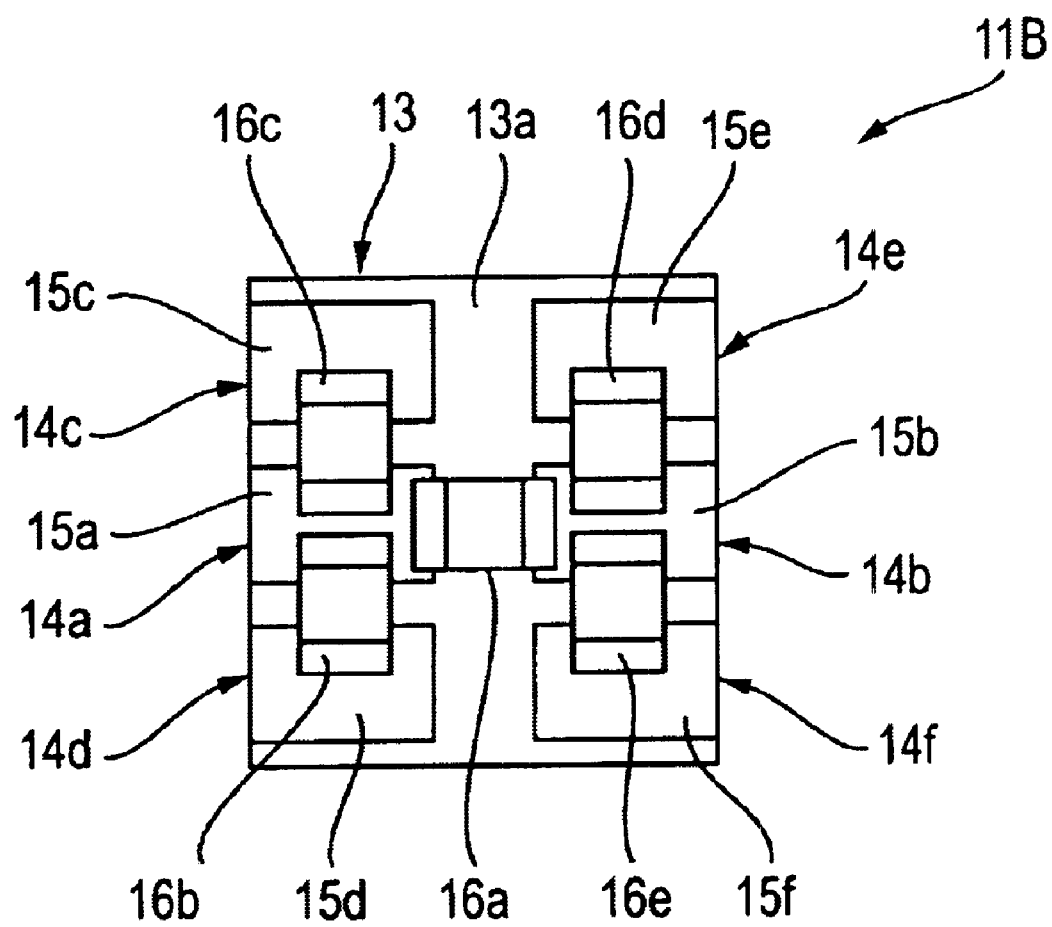
FIG. 5 is a plan view showing an arrangement of the correction-data acquisition sample constituting the measuring system for performing the measurement error correction method according to the present invention.
Figure 6:
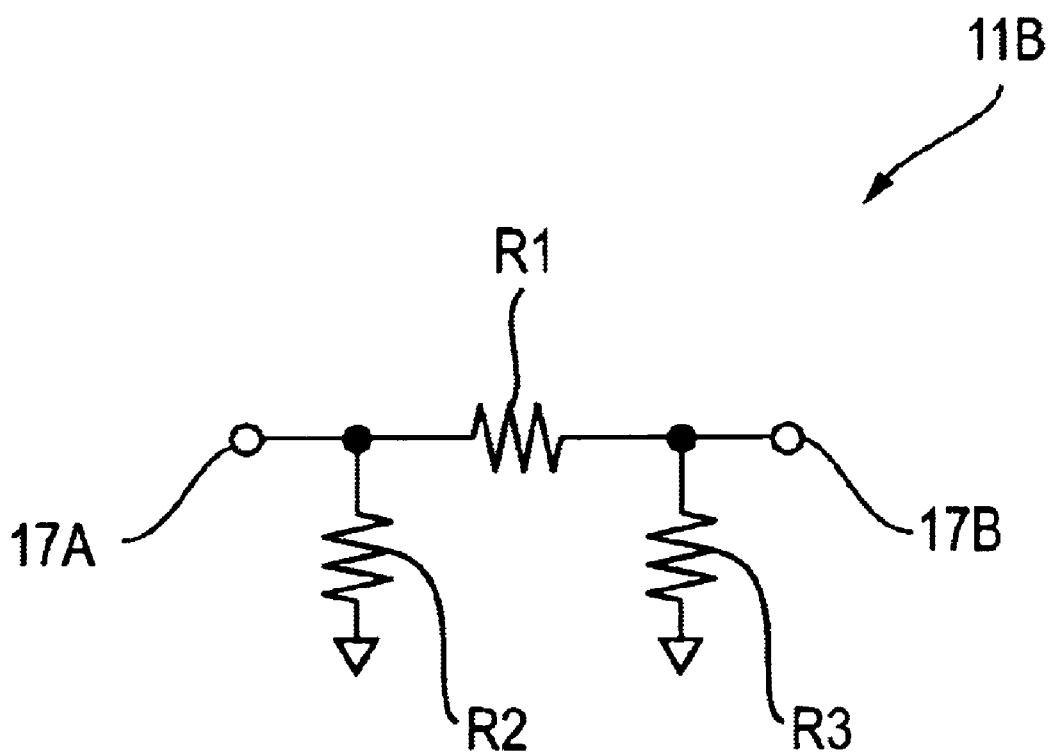
FIG. 6 is an equivalent circuit diagram of the correction-data acquisition sample constituting the measuring system for performing the measurement error correction method according to the present invention.

FIG. 1 is a plan view of an arrangement of a measuring system according to the embodiment; FIG. 2 is a plan view of an arrangement of a measurement fixture; FIG. 3 is a block diagram of a configuration of a network analyzer of an actual measuring system; FIG. 4 is a back view showing an electronic component targeted for measurement and a correction-data acquisition sample; FIG. 5 is a plan view of the correction-data acquisition sample; and FIG. 6 is an equivalent circuit diagram of the correction-data acquisition sample.

A measuring system constituting a reference measuring system 1 and an actual measuring system 2, as shown in FIG. 1, comprises network analyzers 3A and 3B, coaxial cables 4A and 4B, and measurement fixtures 5A and 5B. In addition, the network analyzer 3A and the measurement fixture 5A are provided in the reference measuring system 1 while the network analyzer 3B and the measurement fixture 5B are provided in the actual measuring system 2.

The network analyzers 3A and 3B are measuring systems for measuring electrical characteristics of electronic components used at a high frequency and each has an input-output interface with two-port (port 1' and port 2'). To the ports 1' and 2', the coaxial cables 4A and 4B are connected, respectively. The other ends of the coaxial cables 4A and 4B are provided with coaxial cable connectors 6.

The measurement fixtures 5A and 5B, as shown in FIG. 2, comprise an insulating substrate 7, a wiring connection 8, and coaxial connectors 9A and 9B. The wiring connection 8 formed on a surface 7a of the insulating substrate 7 comprises signal transmission media 8a and 8b and grounding lines 8c to 8f. On the surface 7a of the insulating substrate 7, the signal transmission media 8a and 8b extend from both ends of the substrate toward the center of the substrate, respectively, so that both extended ends are arranged in the center on the substrate surface 7 to oppose each other with a predetermined separating space therebetween. The grounding lines 8c to 8f are arranged in the center on the substrate surface 7 on both sides of the signal transmission media 8a and 8b, respectively. The lines 8a and 8b located on the side of the transmission medium 8a and the lines 8e and 8f located on the side of the transmission medium 8b are arranged in the center on the substrate surface 7 to oppose each other with a predetermined separating space (identical to that of the signal transmission media 8a and 8b) therebetween.

The signal transmission media 8a and 8b are connected to inner conductor contacts (not shown) of the coaxial connectors 9A and 9B at substrate ends. The grounding lines 8c to 8f are connected to a ground pattern (not shown) on the back surface of the substrate via through-hole connections 10. The grounding lines 8c to 8f are further connected to outer conductor contacts (not shown) of the coaxial connectors 9A and 9B via the ground pattern.

In FIG. 2, the measurement fixture 5A of the reference measuring system 1 (referred to as a reference measurement fixture below) and the measurement fixture 5B of the actual measuring system 2 (referred to as a actual measurement fixture below) have the same shape; however, they are not necessarily identical. In particular, the actual measurement fixture 5B may have a shape different from the reference measurement fixture 5A, such as a shape suitable for an automatic sorting measuring system.

The network analyzer 3B constituting the actual measuring system 2, as shown in FIG. 3, comprises a network analyzer body 20 and a control unit 21. The control unit 21 comprises a control unit body 22, a memory 23, an interrelation equation computing means 24, and a correcting means 25.

A target electronic component 11A and a correction-data acquisition sample 11B, as shown in FIG. 4, comprise transmission medium terminals 12a and 12b or pseudo-transmission medium terminals 14a and 14b, and grounding terminals 12c to 12f or pseudo-grounding terminals 14c to 14f, which are formed on back surfaces 11a thereof. By abutting the back surfaces 11a of the target electronic component 11A and the correction-data acquisition sample 11B on a surface 7a of the measurement fixture 5, the transmission medium terminals 12a and 12b (or the pseudo-transmission medium terminals 14a and 14b) and the grounding terminals 12c to 12f (or pseudo-grounding terminals 14c to 14f) are press-bonded on the signal transmission media 8a and 8b and the grounding lines 8c to 8f, respectively. Thereby, the target electronic component 11A and the correction-data acquisition sample 11B are mounted on the measurement fixtures 5A and 5B for measurement, respectively.

According to this embodiment, as the correction-data acquisition sample 11B, a sample is prepared generating the same electrical characteristics as arbitrary electrical characteristics of the target electronic component 11A by measurement operation of the measuring systems 1 and 2. Moreover, according to this embodiment, as the correction-data acquisition sample 11B also prepared are a plurality (six, for example) of samples $11B_{1\ to\ 6}$ having the electrical characteristics different from each other generated by the measuring system.

The correction-data acquisition samples $11B_{1\ to\ 6}$, as shown in FIG. 5, comprise a frame 13 having the same shape as that of the target electronic component 11A. The frame 13 is provided with the pseudo-transmission medium terminals 14a and 14b and the pseudo-grounding terminals 14c to 14f, which respectively have the same arrangements as those of the transmission medium terminals 12a and 12b and the grounding terminals 12c to 12f of the target electronic component 11A. These pseudo-transmission medium terminals 14a and 14b and the pseudo-grounding terminals 14c to 14f extend from the bottom surface of the frame 13 to the top surface 13a via side surfaces. The extended ends on the top surface 13a of the pseudo-transmission medium terminals 14a and 14b and the pseudo-grounding terminals 14c to 14f constitute mounting terminals 15a to 15f, respectively.

Between the mounting terminals neighboring with each other (15a and 15b), (15a and 15d), (15a and 15c), (15b and 15e), and (15b and 15f), electrical characteristic adjusting elements 16a to 16e made of resistance elements are mounted.

In the correction-data acquisition samples $11B_{1\ to\ 6}$ having the electrical characteristic adjusting elements 16a to 16e mounted thereon in such a manner, as shown in the equivalent circuit of FIG. 6, between input and output terminals 17A and 17B, a resistance component R1 is arranged. Between the input and output terminals 17A and 17B and the ground potential, resistance components R2 and R3 are arranged. Arbitrarily setting electrical characteristics (resistance value for the resistance element) of the electrical characteristic adjusting elements 16a to 16e enables the characteristics (electrical characteristics measured by the measuring system) of the correction-data acquisition samples $11B_{1\ to\ 6}$ to be randomly set. According to this embodiment, it is not necessary to set precise values of electrical characteristics generated by the measurement operation of the measuring system to the correction-data acquisition samples $11B_{1\ to\ 6}$ in advance. Therefore, the cost of producing the correction-data acquisition samples $11B_{1\ to\ 6}$ can be reduced.

A correction method (analytical relative correction method) of measurement errors according to this embodiment and performed by the measuring system will be described below.

First, the outline will be described. As a common problem in the high-frequency characteristic measurement of a noncoaxial-type sample, the measured result of the characteristics (a scattering coefficient, etc.) differs from one measuring system to another. Specifically, the measured result of the correction-data acquisition sample 11B by the measuring system (reference measuring system 1) including a fixture for quality assurance to users (reference measurement fixture 5A) differs from the measured result of the correction-data acquisition sample 11B by the measuring system (actual measuring system 2) including a fixture for use on delivery inspection (actual measurement fixture 5B). Such a discrepancy between measured results disables quality assurance to users on delivery inspection.

Then, according to this embodiment, in order to overcome such a problem, the measured result by the reference measuring system 1 is assumed from the measured result by the actual measuring system by computation using a relative correction method.

The principle of a correction method (analytical relative correction method) according to this embodiment, which corresponds to a two-port unbalanced measuring system, will be described below.

First, error factors of the measuring systems (the reference measuring system 1 and the actual measuring system 2) are modeled according to a signal transfer pattern shown in FIG. 7. The signal transfer pattern shown in FIG. 7 is identical with a 2-Port error model that is generally used.

The signal transfer pattern (error model) shown in FIG. 7 is an extremely accurate model for a coaxial measurement system. Strictly speaking, it is not so accurate for a noncoaxial measurement system, which is caused by the fact that the treatment of leakage is partially alienated from actual physical phenomena.

According to this embodiment, this signal transfer pattern (error model) is adopted because the model has been in worldwide use for a long time while even knowing that, strictly speaking, it is not accurate for a noncoaxial measurement system. However, according to need, a more accurate signal transfer pattern may be produced so as to deduce a formula of a relative correction method therefrom. Although the signal transfer pattern shown in FIG. 7 may lead to some error when a measurement fixture develops leakage, the error is not very large when there is small leakage in the measurement fixture (having good isolation).

If entire error factors are identified in the signal transfer pattern, from measured values ($S_{11M}$, $S_{21M}$, $S_{12M}$, and $S_{22M}$) of the correction-data acquisition samples $11B_{1\ to\ 6}$, scattering coefficient true values ($S_{11A}$, $S_{21A}$, $S_{12A}$, and $S_{22A}$) are obtained by theoretical equations (A1a) to (A1d). The theoretical equations (A1a) to (A1d) can be deduced by building the equations on the signal transfer pattern shown in FIG. 7.

[Numerical Formula 11]

$$S_{11A} = ((S_{11M} - E_{DF}) * (E_{SR} * (S_{22M} - E_{DR})/E_{RR} + 1)/E_{RF} - \\ E_{LF} * (S_{12M} - E_{XR}) * (S_{21M} - E_{XF})/(E_{TF} * E_{TR}))/ \\ ((E_{SF} * (S_{11M} - E_{DF})/E_{RF} + 1) * \\ (E_{SR} * (S_{22M} - E_{DR})/E_{RR} + 1) - \\ E_{LF} * E_{LR} * (S_{12M} - E_{XR}) * (S_{21M} - E_{XF})/(E_{TF} * E_{TR})) \quad (A1a)$$

$$S_{21A} = (S_{21M} - E_{XF}) * ((E_{SR} - E_{LF}) * (S_{22M} - E_{DR})/E_{RR} + 1)/ \\ (E_{TF} * ((E_{SF} * (S_{11M} - E_{DF})/E_{RF} + 1) * \\ (E_{SR} * (S_{22M} - E_{DR})/E_{RR} + 1) - E_{LF} * E_{LR} * \\ (S_{12M} - E_{XR}) * (S_{21M} - E_{XF})/(E_{TF} * E_{TR}))) \quad (A1b)$$

$$S_{12A} = ((E_{SF} - E_{LR}) * (S_{11M} - E_{DF})/E_{RF} + 1) * \\ (S_{12M} - E_{XR})/(E_{TR} * ((E_{SF} * (S_{11M} - E_{DF})/E_{RF} + 1) * \\ (E_{SR} * (S_{22M} - E_{DR})/E_{RR} + 1) - E_{LF} * E_{LR} * \\ (S_{12M} - E_{XR}) * (S_{21M} - E_{XF})/(E_{TF} * E_{TR}))) \quad (A1c)$$

$$S_{22A} = ((E_{SF} * (S_{11M} - E_{DF})/E_{RF} + 1) * (S_{22M} - E_{DR})/E_{RR} - \\ E_{LR} * (S_{12M} - E_{XR}) * (S_{21M} - E_{XF})/(E_{TF} * E_{TR}))/ \\ ((E_{SF} * (S_{11M} - E_{DF})/E_{RF} + 1) * \\ (E_{SR} * (S_{22M} - E_{DR})/E_{RR} + 1) - \\ E_{LF} * E_{LR} * (S_{12M} - E_{XR}) * (S_{21M} - E_{XF})/(E_{TF} * E_{TR})) \quad (A1d)$$

After the correction-data acquisition samples $11B_{1\ to\ 6}$, in which the scattering coefficient true values are values ($S_{11A}$, $S_{21A}$, $S_{12A}$, and $S_{22A}$), are measured, in the reference measuring system 1, the scattering coefficient values ($S_{11D}$, $S_{21D}$, $S_{12D}$, and $S_{22D}$) are measured while in the actual reference measuring system 2, the scattering coefficient values ($S_{11M}$, $S_{21M}$, $S_{12M}$, and $S_{22M}$) are measured.

In descriptions below, the error factor of the reference measuring system 1 (the measurement fixture 5A) will be expressed by adding a subscript 1 to the name of the error factor, as $E_{DP1}$, for example, while the error factor of the actual measuring system 2 (the measurement fixture 5B) will be expressed by adding a subscript 2 to the name of the error factor, as $E_{XR2}$. The name of the error factor corresponds to that shown in FIG. 7.

Wherein, the scattering-coefficient true values ($S_{11A}$, $S_{21A}$, $S_{12A}$, and $S_{22A}$) of the correction-data acquisition samples 11B, and the error-factor values of the reference measuring system 1 (the measurement fixture 5A) and the actual measuring system 2 (the measurement fixture 5B) are practically impossible to be known. Whereas, the measured values ($S_{11D}$, $S_{21D}$, $S_{12D}$, and $S_{22D}$) by the reference measuring system 1 and the measured values ($S_{11M}$, $S_{21M}$, $S_{12M}$, and $S_{22M}$) by the actual measuring system 2 are possible to be known by actual measurement.

It is an object of the relative correction method according to this embodiment to obtain the measured values by the reference measuring system 1 from the measured values by the actual measuring system 2.

It is assumed that the error-factors of the reference measuring system 1 (the measurement fixture 5A) and the actual measuring system 2 (the measurement fixture 5B) are identified. At this time, when theoretical arithmetic equations showing the relationship between each of the measured values by the reference measuring system 1 and the actual measuring system 2 and its scattering coefficient are considered on the basis of the aforementioned theoretical equations (A1a) to (A1d), the following theoretical arithmetic equations (A2a) to (A2d) and theoretical arithmetic equations (A3a) to (A3d) are effected. These theoretical arithmetic equations show that the sample scattering coefficients can be calculated from the measured values by the measuring systems 1 and 2 (the measurement fixtures 5A and 5B) as long as the error factors in the measuring systems 1 and 2 (the measurement fixtures 5A and 5B) are identified.

[Numerical Formula 12]

$$S_{11A} = ((S_{11D} - E_{DF1})*(E_{SR1}*(S_{22D} - E_{DR1})/E_{RR1} + 1)/E_{RF1} - \\ E_{LF1}*(S_{12D} - E_{XR1})*(S_{21D} - E_{XF1})/(E_{TF1}*E_{TR1}))/ \\ ((E_{SF1}*(S_{11D} - E_{DF1})/E_{RF1} + 1)* \\ (E_{SR1}*(S_{22D} - E_{DR1})/E_{RR1} + 1) - \\ E_{LF1}*E_{LR1}*(S_{12D} - E_{XR1})*(S_{21D} - E_{XF1})/(E_{TF1}*E_{TR1})) \quad (A2a)$$

$$S_{21A} = (S_{21D} - E_{XF1})*((E_{SR1} - E_{LF1})*(S_{22D} - E_{DR1})/E_{RR1} + 1)/ \\ (E_{TF1}*((E_{SF1}*(S_{11D} - E_{DF1})/E_{RF1} + 1)* \\ (E_{SR1}*(S_{22D} - E_{DR1})/E_{RR1} + 1) - E_{LF1}*E_{LR1}* \\ (S_{12D} - E_{XR1})*(S_{21D} - E_{XF1})/(E_{TF1}*E_{TR1}))) \quad (A2b)$$

$$S_{12A} = ((E_{SF1} - E_{LR1})*(S_{11D} - E_{DF1})/E_{RF1} + 1)* \\ (S_{12D} - E_{XR1})/(E_{TR1}*((E_{SF1}*(S_{11D} - E_{DF1})/E_{RF1} + 1)* \\ (E_{SR1}*(S_{22D} - E_{DR1})/E_{RR1} + 1) - E_{LF1}*E_{LR1}* \\ (S_{12D} - E_{XR1})*(S_{21D} - E_{XF1})/(E_{TF1}*E_{TR1}))) \quad (A2c)$$

$$S_{22A} = ((E_{SF1}*(S_{11D} - E_{DF1})/E_{RF1} + 1)*(S_{22D} - E_{DR1})/E_{RR1} - \\ E_{LR1}*(S_{12D} - E_{XR1})*(S_{21D} - E_{XF1})/(E_{TF1}*E_{TR1}))/ \\ ((E_{SF1}*(S_{11D} - E_{DF1})/E_{RF1} + 1)* \\ (E_{SR1}*(S_{22D} - E_{DR1})/E_{RR1} + 1) - \\ E_{LF1}*E_{LR1}*(S_{12D} - E_{XR1})*(S_{21D} - E_{XF1})/(E_{TF1}*E_{TR1})) \quad (A2d)$$

[Numerical Formula 13]

$$S_{11A} = ((S_{11M} - E_{DF2})*(E_{SR2}*(S_{22M} - E_{DR2})/E_{RR2} + 1)/E_{RF2} - \\ E_{LF2}*(S_{12M} - E_{XR2})*(S_{21M} - E_{XF2})/(E_{TF2}*E_{TR2}))/ \\ ((E_{SF2}*(S_{11M} - E_{DF2})/E_{RF2} + 1)* \\ (E_{SR2}*(S_{22M} - E_{DR2})/E_{RR2} + 1) - \\ E_{LF2}*E_{LR2}*(S_{12M} - E_{XR2})*(S_{21M} - E_{XF2})/(E_{TF2}*E_{TR2})) \quad (A3a)$$

$$S_{21A} = (S_{21M} - E_{XF2})*((E_{SR2} - E_{LF2})*(S_{22M} - E_{DR2})/E_{RR2} + 1)/ \\ (E_{TF2}*((E_{SF2}*(S_{11M} - E_{DF2})/E_{RF2} + 1)* \\ (E_{SR2}*(S_{22M} - E_{DR2})/E_{RR2} + 1) - E_{LF2}*E_{LR2}* \\ (S_{12M} - E_{XR2})*(S_{21M} - E_{XF2})/(E_{TF2}*E_{TR2}))) \quad (A3b)$$

$$S_{12A} = ((E_{SF2} - E_{LR2})*(S_{11M} - E_{DF2})/E_{RF2} + 1)* \\ (S_{12M} - E_{XR2})/(E_{TR2}*((E_{SF2}*(S_{11M} - E_{DF2})/E_{RF2} + 1)* \\ (E_{SR2}*(S_{22M} - E_{DR2})/E_{RR2} + 1) - E_{LF2}*E_{LR2}* \\ (S_{12M} - E_{XR2})*(S_{21M} - E_{XF2})/(E_{TF2}*E_{TR2}))) \quad (A3c)$$

$$S_{22A} = ((E_{SF2}*(S_{11M} - E_{DF2})/E_{RF2} + 1)*(S_{22M} - E_{DR2})/E_{RR2} - \\ E_{LR2}*(S_{12M} - E_{XR2})*(S_{21M} - E_{XF2})/(E_{TF2}*E_{TR2}))/ \\ ((E_{SF2}*(S_{11M} - E_{DF2})/E_{RF2} + 1)* \\ (E_{SR2}*(S_{22M} - E_{DR2})/E_{RR2} + 1) - \\ E_{LF2}*E_{LR2}*(S_{12M} - E_{XR2})*(S_{21M} - E_{XF2})/(E_{TF2}*E_{TR2})) \quad (A3d)$$

By the way, if the same sample is measured by both the reference measuring system 1 and the actual measuring system 2, the sample scattering coefficient becomes identical between the theoretical arithmetic equations (A2a) to (A2d) and theoretical arithmetic equations (A3a) to (A3d). Then, when the sample scattering coefficients ($S_{11A}$, $S_{21A}$, $S_{12A}$, and $S_{22A}$) are eliminated from each of the theoretical arithmetic equations (A2a) to (A2d) and theoretical arithmetic equations (A3a) to (A3d), the following interrelation equations (A4a) to (A4d) are obtained. The interrelation equations (A4a) to (A4d) show the relationship between the measured results by the reference measuring system 1 and by the actual measuring system 2.

[Numerical Formula 14]

$$S_{11D} = E_{DF1} + \\ E_{RF1}*((-E_{SR1}*(S_{11M} - E_{DF2})*(S_{22M} - E_{DR2})/(E_{RF2}*E_{RR2}) + \\ E_{LF2}*(S_{11M} - E_{DF2})*(S_{22M} - E_{DR2})/(E_{RF2}*E_{RR2}) - \\ E_{LF2}*(S_{12M} - E_{XR2})*(S_{21M} - E_{XF2})/(E_{TF2}*E_{TR2}) + \\ E_{LF1}*(S_{12M} - E_{XR2})*(S_{21M} - E_{XF2})/(E_{TF2}*E_{TR2}) - \\ (S_{11M} - E_{DF2})/E_{RF2}))/ \\ (E_{SF2}*E_{SR1}*(S_{11M} - E_{DF2})*(S_{22M} - E_{DR2})/ \\ (E_{RF2}*E_{RR2}) - E_{SF1}*E_{SR1}*(S_{11M} - E_{DF2})* \\ (S_{22M} - E_{DR2})/(E_{RF2}*E_{RR2}) - E_{LF2}*E_{SF2}* \\ (S_{11M} - E_{DF2})*(S_{22M} - E_{DR2})/(E_{RF2}*E_{RR2}) + E_{LF2}* \\ E_{SF1}*(S_{11M} - E_{DF2})*(S_{22M} - E_{DR2})/(E_{RF2}*E_{RR2}) - \\ E_{SR1}*(S_{22M} - E_{DR2})/E_{RR2} + \\ E_{LF2}*(S_{22M} - E_{DR2})/E_{RR2} + E_{LF2}*E_{SF2}* \\ (S_{12M} - E_{XR2})*(S_{21M} - E_{XF2})/(E_{TF2}*E_{TR2}) - E_{LF1}* \\ E_{SF2}*(S_{12M} - E_{XR2})*(S_{21M} - E_{XF2})/(E_{TF2}*E_{TR2}) - \\ E_{LF2}*E_{LR1}*(S_{12M} - E_{XR2})* \\ (S_{21M} - E_{XF2})/(E_{TF2}*E_{TR2}) + E_{LF1}*E_{LR1}* \\ (S_{12M} - E_{XR2})*(S_{21M} - E_{XF2})/(E_{TF2}*E_{TR2}) + \\ E_{SF2}*(S_{11M} - E_{DF2})/E_{RF2} - \\ E_{SF1}*(S_{11M} - E_{DF2})/E_{RF2} - 1) \quad (A4a)$$

[Numerical Formula 15]

$$S_{21D} = \quad (A4b)$$
$$E_{XF1} + E_{TF1} * (-(S_{21M} - E_{XF2}) * (E_{SR1} * (S_{22M} - E_{DR2})/E_{RR2} -$$
$$E_{LF1} * (S_{22M} - E_{DR2}) * /E_{RR2} + 1))/$$
$$(E_{TF2} * (E_{SF2} * E_{SR1} * (S_{11M} - E_{DF2}) * (S_{22M} - E_{DR2})/$$
$$(E_{RF2} * E_{RR2}) - E_{SF1} * E_{SR1} * (S_{11M} - E_{DF2}) *$$
$$(S_{22M} - E_{DR2})/(E_{RF2} * E_{RR2}) - E_{LF2} * E_{SF2} *$$
$$(S_{11M} - E_{DF2}) * (S_{22M} - E_{DR2})/(E_{RF2} * E_{RR2}) +$$
$$E_{LF2} * E_{SF1} * (S_{11M} - E_{DF2}) * (S_{22M} - E_{DR2})/$$
$$(E_{RF2} * E_{RR2}) - E_{SR1} * (S_{22M} - E_{DR2})/E_{RR2} +$$
$$E_{LF2} * (S_{22M} - E_{DR2})/E_{RR2} + E_{LF2} * E_{SF2} *$$
$$(S_{12M} - E_{XR2}) * (S_{21M} - E_{XF2})/(E_{TF2} * E_{TR2}) -$$
$$E_{LF1} * E_{SF2} * (S_{12M} - E_{XR2}) *$$
$$(S_{21M} - E_{XF2})/(E_{TF2} * E_{TR2}) - E_{LF2} * E_{LR1} *$$
$$(S_{12M} - E_{XR2}) * (S_{21M} - E_{XF2})/(E_{TF2} * ET_{R2}) +$$
$$E_{LF1} * E_{LR1} * (S_{12M} - E_{XR2}) * (S_{21M} - E_{XF2})/$$
$$(E_{TF2} * E_{TR2}) + E_{SF2} * (S_{11M} - E_{DF2})/E_{RF2} -$$
$$E_{SF1} * (S_{11M} - E_{DF2})/E_{RF2} - 1))$$

[Numerical Formula 16]

$$S_{12D} = E_{XR1} + \quad (A4c)$$
$$E_{TR1} * ((-E_{SF1} * (S_{11M} - E_{DF2})/E_{RF2} + E_{LR1} * (S_{12M} - E_{XR2}))/$$
$$(E_{TR2} * (E_{SF1} * E_{SR2} * (S_{11M} - E_{DF2}) * (S_{22M} - E_{DR2})/$$
$$(E_{RF2} * E_{RR2}) - E_{LR2} * E_{SR2} * (S_{11M} - E_{DF2}) *$$
$$(S_{22M} - E_{DR2})/(E_{RF2} * E_{RR2}) - E_{SF1} * E_{SR1} *$$
$$(S_{11M} - E_{DF2}) * (S_{22M} - E_{DR2})/(E_{RF2} * E_{RR2}) +$$
$$E_{LR2} * E_{SR1} * (S_{11M} - E_{DF2}) * (S_{22M} - E_{DR2})/$$
$$(E_{RF2} * E_{RR2}) + E_{SR2} * (S_{22M} - E_{DR2})/E_{RR2} -$$
$$E_{SR1} * (S_{22M} - E_{DR2})/E_{RR2} + E_{LR2} * E_{SR2} *$$
$$(S_{12M} - E_{XR2}) * (S_{21M} - E_{XF2})/(E_{TF2} * E_{TR2}) -$$
$$E_{LR1} * E_{SR2} * (S_{12M} - E_{XR2}) *$$
$$(S_{21M} - E_{XF2})/(E_{TF2} * E_{TR2}) - E_{LF1} * E_{LR2} *$$
$$(S_{12M} - E_{XR2}) * (S_{21M} - E_{XF2})/(E_{TF2} * E_{TR2}) +$$
$$E_{LF1} * E_{LR1} * (S_{12M} - E_{XR2}) * (S_{21M} - E_{XF2})/$$
$$(E_{TF2} * E_{TR2}) - E_{SF1} * (S_{11M} - E_{DF2})/E_{RF2} +$$
$$E_{LR2} * (S_{11M} - E_{DF2})/E_{RF2} - 1)$$

[Numerical Formula 17]

$$S_{22D} = E_{DR1} + E_{RR1} * \quad (A4d)$$
$$((-E_{SF1} * (S_{11M} - E_{DF2}) * (S_{22M} - E_{DR2})/E_{RF2} * E_{RR2}) +$$
$$E_{LR2} * (S_{11M} - E_{DF2}) * (S_{22M} - E_{DR2})/(E_{RF2} * E_{RR2}) -$$
$$(S_{22M} - E_{DR2})/E_{RR2} -$$
$$E_{LR2} * (S_{12M} - E_{XR2}) * (S_{21M} - E_{XF2})/(E_{TF2} * E_{TF2}) +$$
$$E_{LR1} * (S_{12M} - E_{XR2}) * (S_{21M} - E_{XF2})/(E_{TF2} * E_{TF2})))/$$
$$(E_{SF1} * E_{SR2} * (S_{11M} - E_{DF2}) * (S_{22M} - E_{DR2})/(E_{RF2} * E_{RR2}) -$$
$$E_{LR2} * E_{SR2} * (S_{11M} - E_{DF2}) *$$
$$(S_{22M} - E_{DR2})/(E_{RF2} * E_{RR2}) -$$
$$E_{SF1} * E_{SR1} * (S_{11M} - E_{DF2}) * (S_{22M} - E_{DR2})/(E_{RF2} * E_{RR2}) +$$
$$E_{LR2} * E_{SR1} * (S_{11M} - E_{DF2}) * (S_{22M} - E_{DR2})/(E_{RF2} * E_{RR2}) +$$
$$E_{SR2} * (S_{22M} - E_{DR2})/E_{RR2} -$$
$$E_{SR1} * (S_{22M} - E_{DR2})/E_{RR2} +$$
$$E_{LR2} * E_{SR2} * (S_{12M} - E_{XR2}) * (S_{21M} - E_{XF2})/(E_{TF2} * E_{TR2}) -$$
$$E_{LR1} * E_{SR2} * (S_{12M} - E_{XR2}) * (S_{21M} - E_{XF2})/(E_{TF2} * E_{TR2}) -$$
$$E_{LF1} * E_{LR2} * (S_{12M} - E_{XR2}) * (S_{21M} - E_{XF2})/(E_{TF2} * E_{TR2}) +$$
$$E_{LF1} * E_{LR1} * (S_{12M} - E_{XR2}) * (S_{21M} - E_{XF2})/(E_{TF2} * E_{TR2}) -$$
$$E_{SF1} * (S_{11M} - E_{DF2})/E_{RF2} +$$
$$E_{LR2} * (S_{11M} - E_{DF2})/E_{RF2} - 1)$$

The interrelation equations (A4a) to (A4d) obtained in such a manner are rearranged with regard to the measured values ($S_{11M}$, $S_{21M}$, $S_{12M}$, and $S_{22M}$) measured by the actual measuring system 2 (the measurement fixture 5B). Furthermore, in order to simplify the rearranged equations, the error factors are appropriately substituted for variables. Then, the following interrelation equations (A5a) to (A5d) are obtained. In the interrelation equations OLE_LINK1 (A5a) to (A5d) OLE_LINK1, $a_0$, $a_1$, $a_3$, $b_0$, $b_1$, $b_3$, $c_0$, $c_1$, $c_3$, $d_0$, $d_1$, $e_0$, $e_1$, $e_3$, $f_0$, $f_1$, k, and m, which are 18 coefficients in total, and $E_{XF1}$, $E_{XR1}$, $E_{XF2}$, and $E_{XR2}$, which are four coefficients in total, are undetermined coefficients including in the interrelation equations. The undetermined coefficients used in denominators in right-side fractional sections of equations with regard to $S_{11D}$, $S_{21D}$, $S_{22D}$, and $S_{12D}$ use the same symbols, showing that each coefficient is entirely identical with each other.

[Numerical Formula 18]

$$S_{11D} = (c_0 * S_{11M} * S_{22M} + c_1 * (S_{12M} - E_{XR2}) * (S_{21M} - E_{XF2}) + \quad (A5a)$$
$$k * c_0 * S_{11M} + c_3 * S_{22M} + k * c_3)/$$
$$(a_0 * S_{11M} * S_{22M} + a_1 * (S_{12M} - E_{XR2}) * (S_{21M} - E_{XF2}) +$$
$$k * a_0 * S_{11M} + a_3 * S_{22M} + k * a_3)$$

$$S_{21D} = E_{XF1} + (d_0 * (S_{21M} - E_{XF2}) * S_{22M} + d_1 * (S_{21M} - E_{XF2}))/ \quad (A5b)$$
$$(a_0 * S_{11M} * S_{22M} + a_1 * (S_{12M} - E_{XR2}) * (S_{21M} - E_{XF2}) +$$
$$k * a_0 * S_{11M} + a_3 * S_{22M} + k * a_3)$$

$$S_{12D} = E_{XR1} + (e_0 * (S_{12M} - E_{XR2}) * S_{11M} + e_1 * (S_{12M} - E_{XR2}))/ \quad (A5c)$$
$$(b_0 * S_{11M} * S_{22M} + b_1 * (S_{12M} - E_{XR2}) * (S_{21M} - E_{XF2}) +$$
$$m * b_0 * S_{11M} + b_3 * S_{22M} + m * b_3)$$

$$S_{22D} = (f_0 * S_{11M} * S_{22M} + f_1 * (S_{12M} - E_{XR2}) * (S_{21M} - E_{XF2}) + \quad (A5d)$$
$$m * f_0 * S_{22M} + f_3 * S_{11M} + m * f_3)/$$
$$(b_0 * S_{11M} * S_{22M} + b_1 * (S_{12M} - E_{XR2}) * (S_{21M} - E_{XF2}) +$$
$$m * b_0 * S_{22M} + b_3 * S_{11M} + m * b_3)$$

In the interrelation equations (A5a) to (A5d), which are produced in such a manner, it is enough to determine the aforementioned 22 undetermined coefficients. These interrelation equations (A5a) to (A5d) are rational expressions, and leakages, in which two variables ($a_0$ and $b_0$, for example) are set to be one as references, may be mostly assumed negligible.

From the above, the number of undetermined coefficients of the interrelation equations (A5a) to (A5d) is to practically be 16.

Also, when one sample is measured, four equations are obtained.

From the above, when the four correction-data acquisition samples 11B are measured, the undetermined coefficients including in the interrelation equations (A5a) to (A5d) can be theoretically determined.

However, the undetermined coefficients k and m appear as products by other coefficients, and it is not easy to identify the undetermined coefficients appearing in the interrelation equations (A5a) to (A5d). Then, although the required number of the correction-data acquisition samples 11B increases in some degree, the calculation of the undetermined coefficients can be facilitated by treating the products of the coefficients k and m by other coefficients as independent variables so as to linearize the equations. Results of these substitutions are shown in the following interrelation equations (A6a) to (A6d). In these interrelation equations, the undetermined coefficients are $a_0$ to $a_4$, $b_0$ to $b_4$, $c_0$ to $c_4$, $d_0$, $d_1$, $e_0$ to $e_4$, $f_0$, $f_1$, which are 22 coefficients in total, and $E_{XF1}$, $E_{XR1}$, $E_{XF2}$, and $E_{XR2}$, which are four coefficients in total.

[Numerical Formula 19]

$$S_{11D} = (c_0 * S_{11M} * S_{22M} + c_1 * (S_{12M} - E_{XR2}) * (S_{21M} - E_{XF2}) + \\ c_2 * S_{11M} + c_3 * S_{22M} + c_4) / \\ (a_0 * S_{11M} * S_{22M} + a_1 * (S_{12M} - E_{XR2}) * (S_{21M} - E_{XF2}) + \\ a_2 * S_{11M} + a_3 * S_{22M} + a_4) \quad (A6a)$$

$$S_{21D} = E_{XF1} + (d_0 * (S_{21M} - E_{XF2}) * S_{22M} + d_1 * S_{21M})/ \\ (a_0 * S_{11M} * S_{22M} + a_1 * (S_{12M} - E_{XR2}) * (S_{21M} - E_{XF2}) + \\ a_2 * S_{11M} + a_3 * S_{22M} + a_4) \quad (A6b)$$

$$S_{12D} = E_{XR1} + (e_0 * (S_{12M} - E_{XR2}) * S_{11M} + e_1 * (S_{12M} - E_{XR2}))/ \\ (b_0 * S_{11M} * S_{22M} + b_1 * (S_{12M} - E_{XR2}) * (S_{21M} - E_{XF2}) + \\ b_2 * S_{11M} + b_3 * S_{22M} + b_4) \quad (A6c)$$

$$S_{22D} = (f_0 * S_{11M} * S_{22M} + f_1 * (S_{12M} - E_{XR2}) * (S_{21M} - E_{XF2}) + \\ f_2 * S_{11M} + f_3 * S_{22M} + f_4)/ \\ (b_0 * S_{11M} * S_{22M} + b_1 * (S_{12M} - E_{XR2}) * (S_{21M} - E_{XF2}) + \\ b_2 * S_{11M} + b_3 * S_{22M} + b_4) \quad (A6d)$$

In the interrelation equations (A6a) to (A6d), the four coefficients $E_{XF1}$, $E_{XR1}$, $E_{XF2}$, and $E_{XR2}$ are so-called leaks between ports, and they may be negligible in the measuring systems 1 and 2 (measurement fixtures 5A and 5B) with excellent isolation. In this case, it is enough to simply set these undetermined coefficients to be zero. Even when being not negligible, these leaks between ports can be simply estimated. For example, the measured value of the scattering coefficient by the measuring systems 1 and 2 (measurement fixtures 5A and 5B) without the correction-data acquisition sample 11B attached thereto may be appropriated for the leak between ports. The substitution of variables performed by identifying these leakage errors using such an appropriate method enables the interrelation equations (A6a) to (A6d) to be rearranged into the following interrelation equations (A7a) to (A7d). Such substitution of the variables simplifies the equations, so that description below will be made after the substitution.

[Numerical Formula 20]

$$S_{21W} = S_{21M} - E_{XF2} \quad (A7a)$$

$$S_{12W} = S_{12M} - E_{XR2} \quad (A7b)$$

$$S_{21V} = S_{21D} - E_{XF1} \quad (A7c)$$

$$S_{12V} = S_{12D} - E_{XR1} \quad (A7d)$$

The remaining 24 undetermined coefficients constitute right-side fractional sections of the equations, and the interrelation equations (A6a) to (A6d) are basically rational expressions, so that at least one of coefficients including in numerators and denominators can be arbitrarily determined. For example, it is assumed that both $a_0$ and $b_0$ be one, and when the equations are arranged to be vectorial equations, the interrelation equations (A6a) to (A6d) are further rearranged into the following interrelation equations (A8a) to (A8d). Symbol t in the interrelation equations (A8a) to (A8d) indicates a vector, in which rows are replaced with lines.

[Numerical Formula 21]

$$(-S_{11D} * S_{12W} * S_{21W} - S_{11D} * S_{11M} - S_{11D} * S_{22M} - \\ S_{11D} S_{11M} * S_{22M} S_{12W} * S_{21W} S_{11M} S_{22M} 1) \\ (a_1 \; a_2 \; a_3 \; a_4 \; c_0 \; c_1 \; c_2 \; c_3 \; c_4)^t = S_{11D} * S_{11M} * S_{22M} \quad (A8a)$$

$$(-S_{21V} * S_{12W} * S_{21W} - S_{21V} * S_{11M} - \\ S_{21V} * S_{22M} - S_{21V} S_{21W} * S_{22M} S_{21W}) \\ (a_1 \; a_2 \; a_3 \; a_4 \; d_0 \; d_1)^t = S_{21V} * S_{11M} * S_{22M} \quad (A8b)$$

$$(-S_{12V} * S_{12W} * S_{21W} - S_{12V} * S_{11M} - \\ S_{12V} * S_{22M} - S_{12V} S_{12W} * S_{11M} S_{12W}) \\ (b_1 \; b_2 \; b_3 \; b_4 \; e_0 \; e_1)^t = S_{12V} * S_{11M} * S_{22M} \quad (A8c)$$

$$(-S_{22D} * S_{12W} * S_{21W} - S_{22D} * S_{11M} - \\ S_{22D} * S_{22M} - S_{22D} S_{11M} * S_{22M} S_{12W} * S_{21W} S_{11M} S_{22M} 1) \\ (b_1 \; b_2 \; b_3 \; b_4 \; f_0 \; f_1 \; f_2 \; f_3 \; f_4)^t = S_{22D} * S_{11M} * S_{22M} \quad (A8d)$$

It is noteworthy that the sample scattering coefficients ($S_{11A}$, $S_{21A}$, $S_{12A}$, and $S_{22A}$) are not included in the interrelation equations (A8a) to (A8d), and 22 undetermined coefficients are only included therein. That is, measuring one correction-data acquisition sample 11B with both the reference measuring system 1 (the measurement fixture 5A) and the actual measuring system 2 (the measurement fixture 5B), we can obtain the interrelation equations (A8a) to (A8d).

Accordingly, measuring 5.5 (22/4, 6 actually) correction-data acquisition samples $11B_{1 \; to \; 6}$ with both the reference measuring system 1 (the measurement fixture 5A) and the actual measuring system 2 (the measurement fixture 5B) enables entire undetermined coefficients to be determined using the interrelation equations (A8a) to (A8d).

As described above, when the leakage errors ($E_{XF1}$, $E_{XR1}$, $E_{XF2}$, and $E_{XR2}$) are not eliminated, an additional one correction-data acquisition sample 11B is required for measuring them, so that seven correction-data acquisition samples 11B, to 7 are needed in total.

After the undetermined coefficients are once identified, the values measured by the reference measuring system (the reference measurement fixture) can be calculated from the values of an arbitrary target electronic component 11A measured by the actual measuring system 2 (the actual measurement fixture 5B) using interrelation equations (A6a) to (A6d).

Determining the undetermined coefficients using the interrelation equations (A8a) to (A8d) may employ any method; however, it will take a lot of trouble without a computer. An example of a determining method of the undetermined coefficients using a computer will be described.

First, the leakage errors ($E_{XF1}$, $E_{XR1}$, $E_{XF2}$, and $E_{XR2}$) inherent in the measuring systems 1 and 2 (the measurement fixtures 5A and 5B) are determined by measuring the scattering coefficients in a state of the measurement fixtures 5A and 5B without having the correction-data acquisition samples $11B_{1 \; to \; 6}$ attached thereto. Then, continuously, characteristics (scattering coefficients) of appropriately produced six correction-data acquisition samples $11B_{1 \; to \; 6}$ are measured with both the reference measuring system 1 (the reference measurement fixture 5A) and the actual measuring system 2 (the actual measurement fixture 5B). Thereby, six measured values of the respective reference measuring system 1 and the actual measuring system 2 are obtained. The measured values of the correction-data acquisition samples $11B_{1 \; to \; 6}$ are distinguished with final subscripts, such as $S_{11D1}$, $S_{11D2}$, ..., $S_{11D6}$, and $S_{11M1}$, ..., $S_{11M6}$.

Next, the measured values of the correction-data acquisition samples $11B_{1 \; to \; 6}$ are substituted in the interrelation equations (A8a) and (A8b), and the measured value of the correction-data acquisition sample $11B_6$ is substituted in the interrelation equation (A8a). The following equation (A9) is obtained by rearranging these substituted equations of the measured values to be a determinant.

[Numerical Formula 22]

$$\begin{pmatrix} -S_{11D1}*S_{12W1}*S_{21W1} & -S_{11D1}*S_{11M1} & -S_{11D1}*S_{22M1} & -S_{11D1} & -S_{21V1} & S_{11M1}*S_{22M1} & S_{12W1}*S_{21W1} & S_{11M1} & S_{22M1} & 1 & 0 & 0 \\ -S_{21V1}*S_{12W1}*S_{21W1} & -S_{21V1}*S_{11M1} & -S_{21V1}*S_{22M1} & -S_{21V1} & 0 & 0 & 0 & 0 & 0 & 0 & S_{21W1}*S_{22M1} & S_{21W1} \\ -S_{11D2}*S_{12W2}*S_{21W2} & -S_{11D2}*S_{11M2} & -S_{11D2}*S_{22M2} & -S_{11D2} & -S_{21V2} & S_{11M2}*S_{22M2} & S_{12W2}*S_{21W2} & S_{11M2} & S_{22M2} & 1 & 0 & 0 \\ -S_{21V2}*S_{12W2}*S_{21W2} & -S_{21V2}*S_{11M2} & -S_{21V2}*S_{22M2} & -S_{21V2} & 0 & 0 & 0 & 0 & 0 & 0 & S_{21W2}*S_{22M2} & S_{21W2} \\ -S_{11D3}*S_{12W3}*S_{21W3} & -S_{11D3}*S_{11M3} & -S_{11D3}*S_{22M3} & -S_{11D3} & -S_{21V3} & S_{11M3}*S_{22M3} & S_{12W3}*S_{21W3} & S_{11M3} & S_{22M3} & 1 & 0 & 0 \\ -S_{21V3}*S_{12W3}*S_{21W3} & -S_{21V3}*S_{11M3} & -S_{21V3}*S_{22M3} & -S_{21V3} & 0 & 0 & 0 & 0 & 0 & 0 & S_{21W3}*S_{22M3} & S_{21W3} \\ -S_{11D4}*S_{12W4}*S_{21W4} & -S_{11D4}*S_{11M4} & -S_{11D4}*S_{22M4} & -S_{11D4} & -S_{21V4} & S_{11M4}*S_{22M4} & S_{12W4}*S_{21W4} & S_{11M4} & S_{22M4} & 1 & 0 & 0 \\ -S_{21V4}*S_{12W4}*S_{21W4} & -S_{21V4}*S_{11M4} & -S_{21V4}*S_{22M4} & -S_{21V4} & 0 & 0 & 0 & 0 & 0 & 0 & S_{21W4}*S_{22M4} & S_{21W4} \\ -S_{11D5}*S_{12W5}*S_{21W5} & -S_{11D5}*S_{11M5} & -S_{11D5}*S_{22M5} & -S_{11D5} & -S_{21V5} & S_{11M5}*S_{22M5} & S_{12W5}*S_{21W5} & S_{11M5} & S_{22M5} & 1 & 0 & 0 \\ -S_{21V5}*S_{12W5}*S_{21W5} & -S_{21V5}*S_{11M5} & -S_{21V5}*S_{22M5} & -S_{21V5} & 0 & 0 & 0 & 0 & 0 & 0 & S_{21W5}*S_{22M5} & S_{21W5} \\ -S_{11D6}*S_{12W6}*S_{21W6} & -S_{11D6}*S_{11M6} & -S_{11D6}*S_{22M6} & -S_{11D6} & -S_{21V6} & S_{11M6}*S_{22M6} & S_{12W6}*S_{21W6} & S_{11M6} & S_{22M6} & 1 & 0 & 0 \end{pmatrix} * \begin{pmatrix} a_1 \\ a_2 \\ a_3 \\ a_4 \\ c_0 \\ c_1 \\ c_2 \\ c_3 \\ c_4 \\ d_0 \\ d_1 \end{pmatrix} = \begin{pmatrix} S_{11D1}*S_{11M1}*S_{22M1} \\ S_{21V1}*S_{11M1}*S_{22M1} \\ S_{11D2}*S_{11M2}*S_{22M2} \\ S_{21V2}*S_{11M2}*S_{22M2} \\ S_{11D3}*S_{11M3}*S_{22M3} \\ S_{21V3}*S_{11M3}*S_{22M3} \\ S_{11D4}*S_{11M4}*S_{22M4} \\ S_{21V4}*S_{11M4}*S_{22M4} \\ S_{11D5}*S_{11M5}*S_{22M5} \\ S_{21V5}*S_{11M5}*S_{22M5} \\ S_{11D6}*S_{11M6}*S_{22M6} \end{pmatrix} \quad (A9)$$

Since factors of coefficient matrices and right-side constant term vectors in the equation (A9) are all known, the equation (A9) is only an eleven-system coupled linear equation with regard to the undetermined coefficients ($a_1$ to $a_4$, $c_0$ to $c_4$, $d_0$, and $d_1$). It is easy to solve this equation by a computer to obtain the determined coefficients using a known algorithm such as LU decomposition and Gaussian elimination. Similarly, from the interrelation equations (A8c) and (A8d), undetermined coefficients ($b_1$ to $b_4$, $e_0$ to $e_4$, $f_0$, and $f_1$) can be obtained.

Since the leakage error is comparatively simply identified in many cases, according to this embodiment described above, the leakage errors are individually identified at first, and then, the difference between the values measured by the reference measuring system 1 and the actual measuring system 2, which is caused by effects of the remaining errors, is corrected using the correction-data acquisition samples $11B_{1\ to\ 6}$. Alternatively, the difference between the values measured by the reference measuring system 1 and the actual measuring system 2, which also includes the leakage errors, may be corrected using the correction-data acquisition samples $11B_{1\ to\ 6}$.

According to the present invention, the two-port measuring system is described; however, a one-port and three-or-more-port measuring system may be of course incorporated in the present invention.

According to this embodiment, the generally used two-port error model (signal transfer pattern) is described; however, a different error model (signal transfer pattern) may be of course incorporated in the present invention corresponding to a measuring system such as a fixture.

In the interrelation equations (A4a) to (A4d), if the error factors of the reference measuring system 1 (the measurement fixture 5A) are values of a measuring system absolutely without having errors, that is, when $E_{XF}=0$, $E_{XR}=0$, $E_{DF}=0$, $E_{DR}=0$, $E_{RF}=1$, $E_{RR}=1$, $E_{SF}=0$, $E_{SR}=0$, $E_{TF}=1$, $E_{TR}=1$, $E_{LF}=0$, and $E_{LR}=0$, the interrelation equations (A4a) to (A4d) agree with the theoretical equations (A1a) to (A1d). It is understood from the above that the generally used two-port correction method corresponds to a specific case (the reference fixture is ideal) of the relative correction method according to this embodiment.

According to this embodiment, the present invention has been described in detail by recognizing the error factors of the reference measuring system 1 (the measurement fixture 5A) and the actual measuring system 2 (the measurement fixture 5B); alternatively, a combination of the error factors of the measurement fixtures 5A and 5B and the error factors of the measuring systems 1 and 2 and measurement cable may be considered as one error factor. In this case, the signal transfer pattern (error model) also is directly realized based on the theoretical equations (A1a) to (A1d).

Therefore, from the measured values obtained from a noncalibrated actual measuring system having an actual measurement fixture attached thereto, the values that would be measured by a calibrated reference measuring system having a reference measurement fixture attached thereto can also be precisely obtained.

Other than the determining method of the undetermined factors according to this embodiment, additional several correction-data acquisition samples 11B are measured in advance, and by using these measured values, the undetermined factors may also be determined with a maximum-likelihood method represented by a least-squares method. Such determination can reduce the effect of measuring errors during sample measurement.

Except for the leakage, by four correction-data acquisition samples 11B, coefficients of the correction equations of the analytical relative correction method should be normally determined; however, according to this embodiment, 5.5 (6, actually) correction-data acquisition samples $11B_{1\ to\ 6}$ are used therefor. This is a method conveniently adopted for simplifying the equations.

However, in determining factors using 5.5 correction-data acquisition samples $11B_{1\ to\ 6}$, there are cases where the relationship between factors to be satisfied with each other cannot be satisfied because of the effect of measurement errors of the correction-data acquisition samples. For example, in comparing the interrelation equations (A5a) to (A5d) with the interrelation equations (A6a) to (A6d), the relationship $a_1/a_3=c_4/c_3$ should be satisfied; however, factors to satisfy such relationship may not be obtained depending to the measurement.

In such a case, the factors can be modified into more precise ones by repetitive computations using the measured results of the four correction-data acquisition samples $11B_{1\ to\ 4}$ as evaluation functions and the coefficients obtained from the 5.5 correction-data acquisition samples $11B_{1\ to\ 6}$ as initial values. This is because the initial value of a tentative solution can be easily converged in the true value by the Newton's method as long as the initial value is close to the true value.

The description above is the principle of the relative correction method in the two-port measurement system. Next, the design of the correction-data acquisition sample 11B will be described. In performing the relative correction method, it is a very important problem for the correction accuracy how to generate the correction-data acquisition samples 11B. If the correction-data acquisition samples 11B can be measured without errors by the reference measuring system 1 (reference measurement fixture 5A) and the actual measuring system 2 (actual measurement fixture 5B), respectively, coefficients of the correction equation in the analytical relative correction method are determined directly and exclusively, as long as left-side matrices in the equation (A9) mentioned above do not become peculiar.

However, in the measurement of the correction-data acquisition samples 11B, some errors (including both a systematic error and accidental error) are practically generated by all means. Thereby, an error is generated in coefficients of the correction equation in the analytical relative correction method obtained by the equation (A9).

In the coefficient errors generated in such a manner, the magnitude of the effect is different depending on the kind of the scattering coefficient in the correction-data acquisition samples 11B. For example, one of conditions that are assumed to have the least effect of the correction-data acquisition samples 11B is the case in that the left-side matrix in the equation (A9) comes close to an identity matrix. In addition, in practice, the equation (A9 is operated by applying an idea such as a least squares method not using the equation as it is; the above conditions are also the same in this case.

It will be described below that the correction equation in the analytical relative correction method is produced to be difficult being affected by the measurement errors by the design of the correction-data acquisition samples 11B. It is assumed here to produce the correction-data acquisition samples 11B by mainly combining resistors. This is for simplifying the production of the correction-data acquisition samples 11B.

In order to produce the correction equation in the analytical relative correction method at a high accuracy, the followings are important: the reliability in calculation of coefficients of the correction equation; characteristic proximity between the prepared plural correction-data acquisition samples 11B; and characteristic dependency between the prepared plural correction-data acquisition samples 11B.

First, the condition in that coefficients of the correction equation in the analytical relative correction method can be securely calculated will be described. Using two correction-data acquisition samples 11B having entirely the same characteristics means that the number of correction-data acquisition samples 11B is reduced by one. Therefore, it is easily understood that this is one of the conditions in which the correction coefficients cannot be calculated. This condition can also be mathematically and simply expressed. That is, the left-side determinant value of the equation (A9) is zero. Thus, the correction coefficients cannot be calculated. Therefore, as long as the reverse condition that the left-side determinant value of the equation (A9) does not become zero is satisfied, a solution exists in the equation (A9).

However, the condition that the left-side determinant value of the equation (A9) does not become zero is too abstract for designing the correction-data acquisition samples 11B. Therefore, according to this embodiment, the following measures are used. Although the measure is slightly inaccurate, for practical purposes, there is no problem in such a simple method (a method using the measure) because it scarcely occurs that the determinant value becomes zero.

A first measure is that the following calculated values determined by the designed scattering coefficients of the correction-data acquisition samples 11B do not become extremely small or similar in the entire correction-data acquisition samples 11B. The calculated values are $S_{11}$, $S_{21}$, $S_{12}$, $S_{22}$, $S_{11}*S_{22}$, $S_{21}*S_{12}$, $S_{21}*S_{22}$, $S_{12}*S_{11}$, $S_{11}*S_{21}*S_{12}$, $S_{22}*S_{21}*S_{12}$. In the measure, these calculated values constitute matrix elements corresponding to the respective coefficients, and if the first measure is satisfied, the matrix may approach zero.

A second measure is that the inequality of the calculated values mentioned above for each of the correction-data acquisition samples 11B is to not to be common to each other as small as possible. This measure is based on the fact that if the inequality is different, the matrix may not approach zero.

By satisfying the measures mentioned above, coefficients of the correction equations of the analytical relative correction method can be securely calculated.

Next, the characteristic proximity between the prepared plural correction-data acquisition samples 11B will be described. In the analytical relative correction method according to the present invention, the measurement errors affecting the method cannot be avoided. In order to suppress such an effect of the measurement errors, it is important that the characteristic proximity between the prepared plural correction-data acquisition samples 11B is separated as far as possible, which will be described below.

In the measurement of the correction-data acquisition samples 11B, some errors are generated by all means even if the samples are carefully measured. These errors include all errors such as positioning errors when the correction-data acquisition samples 11B are attached to the measurement fixtures 5A and 5B and measurement drifts or dispersion of the measuring systems 1 and 2.

The method is largely affected by errors whet at least two correction-data acquisition samples 11B have extremely close characteristics. This is easily understood from the fact that the differential coefficient of the correction-data acquisition samples 11B in the vicinity of characteristics is give by a value of the characteristic difference between adjacent correction-data acquisition samples 11B divided by the characteristic distance (norm) of the correction-data acquisition samples 11B. That is, when a divisor is small, a micro-error of a dividend is expanded.

Therefore, in order to suppress the effect of the measurement errors, it is effective that the norm between characteristics of the correction-data acquisition samples 11B is maintained as large as possible. As the norm, a simple geometrical distance (a square root of the squared sum of parameter differences of $S_{11}$ to $S_{22}$) may be used.

It is recognized here that when the correction-data acquisition samples 11B are produced of only resistors, the characteristics thereof are necessarily collected to a real axis and imaginary axial components are scarcely provided. As long as the measurement errors do not exist, even when imaginary components are not provided in characteristics of the correction-data acquisition samples 11B, the imaginary components of the error factors of the measurement fixtures 5A and 5B are principally overlapped, resulting in assuming precise correction coefficients (undetermined coefficients). However, there are cases where the characteristics of only some correction-data acquisition samples 11B have imaginary components. In this case, there is apprehension that a correction coefficient (undetermined coefficient) is obtained, which causes the corrected results of the correction-data acquisition samples 11B having phase rotation to have a large amount of errors. This is liable to become actualized especially in a device (such as an isolator) having scattering coefficients with phase angles being different in forward and backward directions.

When it is difficult to sufficiently reduce the amount of measurement errors of the correction-data acquisition samples 11B (errors that cannot be removed by averaging, such as drifts of the measuring systems 1 and 2), the using of the correction-data acquisition samples 11B with different phase angles is most effective. Specifically, this can be achieved by assembling a delay line and a reactance element such as a capacitor and inductor to the correction-data acquisition samples 11B.

In the target electronic component 11A having a phase angle being different from that of the correction-data acquisition samples 11B, it is also effective to use the target electronic component 11A itself as one of the correction-data acquisition samples 11B. However, in any methods, the frequency bandwidth capable of being measured is limited to the correction-data acquisition samples 11B. In the manner described above, the effect of the measurement error can be suppressed to a minimum.

Next, characteristic dependency between the prepared plural correction-data acquisition samples 11B will be described. The interrelation equations (A6a) to (A6d) described above are equations for assuming the values to be measured by the reference measuring system 1 (reference measurement fixture 5A) from the values measured by the actual measuring system 2 (actual measurement fixture 5B). These equations are simple rational expressions, and both the numerator and denominator are scattering coefficients measured in the correction-data acquisition samples 11B and linear combinations of the product of the coefficients. Therefore, the linear dependence may be produced between terms, which will be described below.

For example, the interrelation equation (A6a), which is an estimated equation of $S_{11D}$, has a section $c_2*S_{11M}+c_3*S_{22M}$ in the numerator. If values are precisely assumed as $c_2$ and $c_3$ on the basis of the measured results of the correction-data acquisition samples 11B, precise correction can be performed by characteristic relative correction of any of the correction-data acquisition samples 11B. However, if the value of $c_2$ is extremely large or conversely, $c_3$ has a sign opposite to $c_2$, there is possibility that each term of the section $c_2*S_{11M}+c_3*S_{22M}$ is cancelled with each other, so that a look-like corrected result of $S_{11D}$ is obtained from the correction-data acquisition samples 11B. Then, in a sample (the target electronic component 11A) other than the correction-data acquisition samples 11B, an extremely large or small error value is assumed as $S_{11D}$.

In order to avoid such a defect, a linearly dependent unrepresentable combination may be added to the characteristics of the correction-data acquisition samples 11B. As for the example of $S_{11}$ and $S_{22}$, the linear dependence is considered as $S_{11}$ increase and $S_{22}$ increase or as $S_{11}$ increase and $S_{22}$ decrease. Therefore, in order to avoid the linear dependence, the correction-data acquisition samples 11B may be combined so as to cause the following both cases:

(1) $S_{11}$ increase and $S_{22}$ increase (2) $S_{11}$ increase and $S_{22}$ decrease.

Similarly, if the following cases are included, the linear dependence cannot occur from the $S_{22}$ side:

(3) $S_{11}$ decrease and $S_{22}$ increase (4) $S_{11}$ decrease and $S_{22}$ decrease.

As characteristic combinations from the interrelation equations (A6a) to (A6d), in which the linear dependence occurs, there are combinations of $S_{11}*S_{22}$ and $S_{21}*S_{12}$ other than $S_{11}$ and $S_{22}$. Therefore, for these combinations, the characteristic design of the correction-data acquisition samples 11B may also be performed paying attention to the similar points described above.

The measurement error correction method according to this embodiment will be specifically described below.

The prepared six correction-data acquisition samples $11B_{1\ to\ 6}$ are mounted on the reference measuring system 1. Then, electrical characteristics of the correction-data acquisition samples $11B_{1\ to\ 6}$ are measured for each frequency point. The SAW filter corresponding to the correction-data acquisition samples $11B_{1\ to\ 6}$ is a high-frequency electronic component, and the electrical characteristic to be measured here is an S parameter comprising a scattering coefficient $S_{11}$ in the forward direction, scattering coefficient $S_{21}$ in the forward direction, scattering coefficient $S_{12}$ in the backward direction, and scattering coefficient $S_{22}$ in the backward direction.

The measured results ($S_{11}^{n*}$, $S_{21}^{n*}$, $S_{12}^{n*}$, and $S_{22}^{n*}$: n: natural numbers of 1 to 6) of the S parameter of the correction-data acquisition samples $11B_{1\ to\ 6}$ on the reference measuring system 1 are input in the actual measuring system 2 via a data input unit thereof (not shown) in advance. The input results ($S_{11}^{n*}$, $S_{21}^{n*}$, $S_{12}^{n*}$, and $S_{22}^{n*}$) measured by the reference measuring system 1 are stored in the memory 23 via the control unit body 22.

On the other hand, similarly, the correction-data acquisition samples $11B_{1\ to\ 6}$ are also mounted on the actual measuring system 2. Then, electrical characteristics of the correction-data acquisition samples $11B_{1\ to\ 6}$ are measured for each frequency point.

The measured results ($S_{11}^{nM}$, $S_{21}^{nM}$, $S_{12}^{nM}$, and $S_{22}^{nM}$: n: natural numbers of 1 to 6) of the S parameter of the correction-data acquisition samples $11B_{1\ to\ 6}$ on the actual measuring system 2 are input in the interrelating formula computing means 24 via the control unit body 22.

After the results ($S_{11}^{nM}$, $S_{21}^{nM}$, $S_{12}^{nM}$, and $S_{22}^{nM}$) of the correction-data acquisition samples $11B_{1\ to\ 6}$ measured by the actual measuring system 2 are input, the interrelating formula computing means 24 reads out the results ($S_{11}^{n*}$, $S_{21}^{n*}$, $S_{12}^{n*}$, and $S_{22}^{n*}$) measured by the reference measuring system 1 from the memory 23 via the control unit body 22.

The interrelating formula computing means 24 computes the interrelation equations between the results measured by the actual measuring system 2 and the results measured by the reference measuring system 1 on the basis of the measured results ($S_{11}^{nM}$, $S_{21}^{nM}$, $S_{12}^{nM}$, and $S_{22}^{nM}$) and the measured results ($S_{11}^{n*}$, $S_{21}^{n*}$, $S_{12}^{n*}$, and $S_{22}^{n*}$). The computing method has been described in detail above with reference to the theoretical equations (A1a to A1d), (A2a to A2d), and (A3a to A3d) and the interrelation equations (A4a to A4d), (A5a to A5d), (A6a to A6d), (A7a to A7d), (A8a to A8d), and (A9), so that the description thereof is omitted.

After the preliminary process described above, electrical characteristics (the S parameter $S_{11}^M$, $S_{21}^M$, $S_{12}^M$, and $S_{22}^M$) of the target electronic component 11A are measured by the network analyzer body 20 in the actual measuring system 2. The measured results of the target electronic component 11A are input in the correcting means 25 via the control unit body 22.

After the measured results of the target electronic component 11A are input, the correcting means 25 reads out the interrelation equations from the memory 23 via the control unit body 22. The correcting means 25 substitutes the electrical characteristics (the S parameter $S_{11}^M$, $S_{21}^M$, $S_{12}^M$, and $S_{22}^M$), which are the measured results of the target electronic component 11A, into the interrelation equations so as to be computed. Thereby, the correcting means 25 corrects the measured results (electrical characteristics) of the target electronic component 11A on the actual measuring system 2 to the electrical characteristics ($S_{11}^*$, $S_{21}^*$, $S_{12}^*$, and $S_{22}^*$), which are assumed to be obtained when being measured by the reference measuring system 1. The correcting means 25 outputs the computed corrected values outsides via the control unit body 22. The output may be displayed on a display unit (not shown) or may be output by a data output unit (not shown) as data.

In addition, this computation process, as described above, may be performed by the control unit 21 built in the network analyzer 3B, or the measured results may be output to an outside computer connected to the network analyzer 3B so as to allow the outside computer to perform the computation process.

Figure 8:
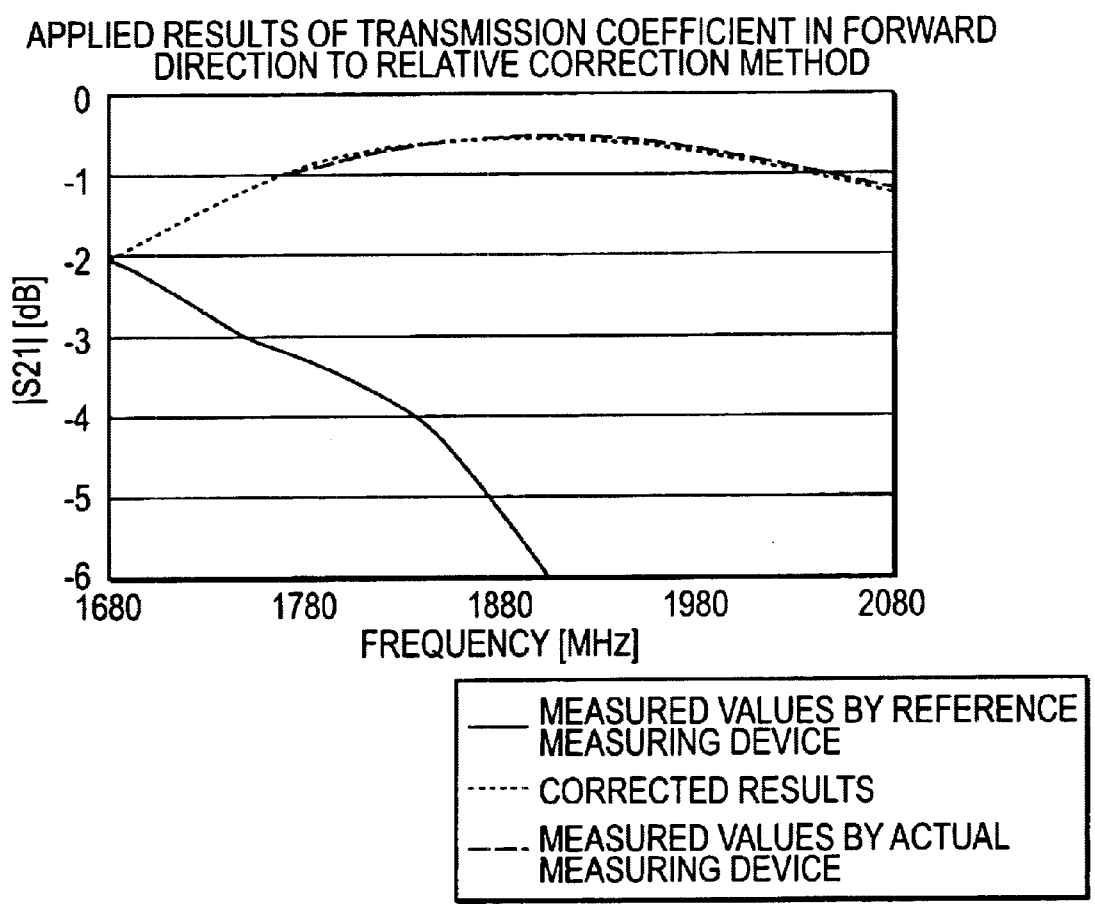
FIG. 8 is a graph showing correction data obtained by performing the measurement error correction method according to the first embodiment of the present invention.
Figure 9:
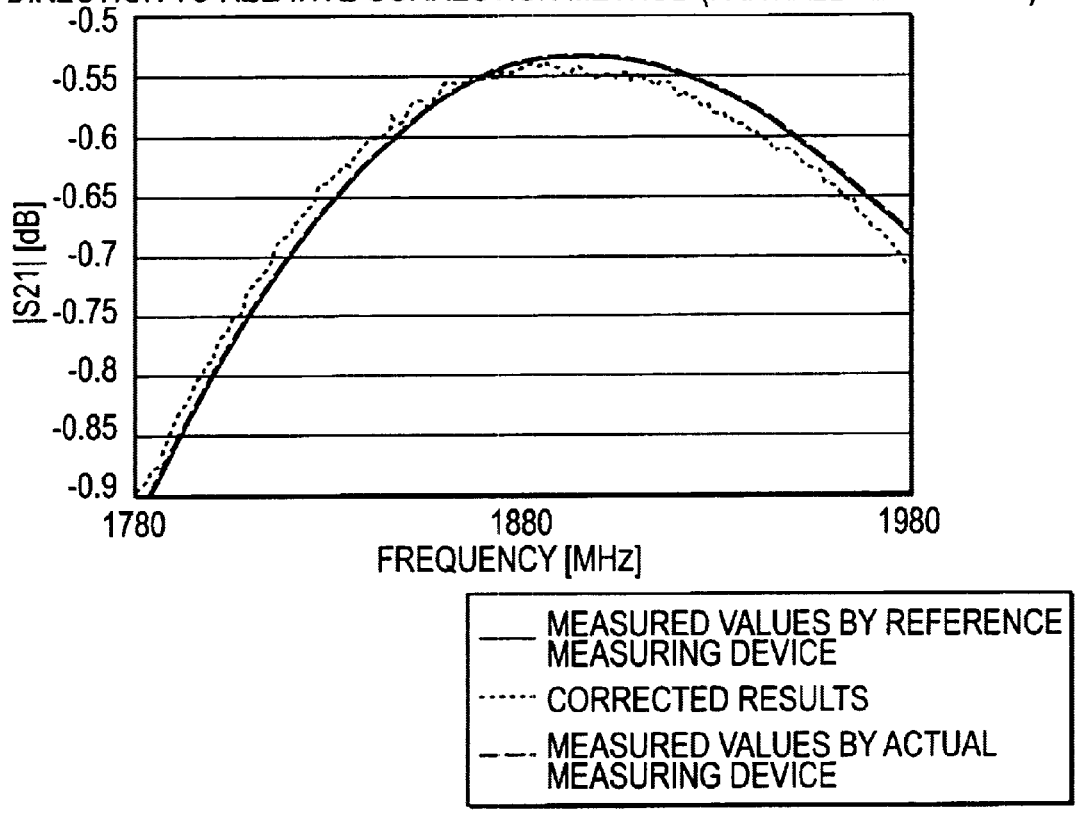
FIG. 9 is a graph showing correction data obtained by performing the measurement error correction method according to the first embodiment of the present invention.
Figure 10:
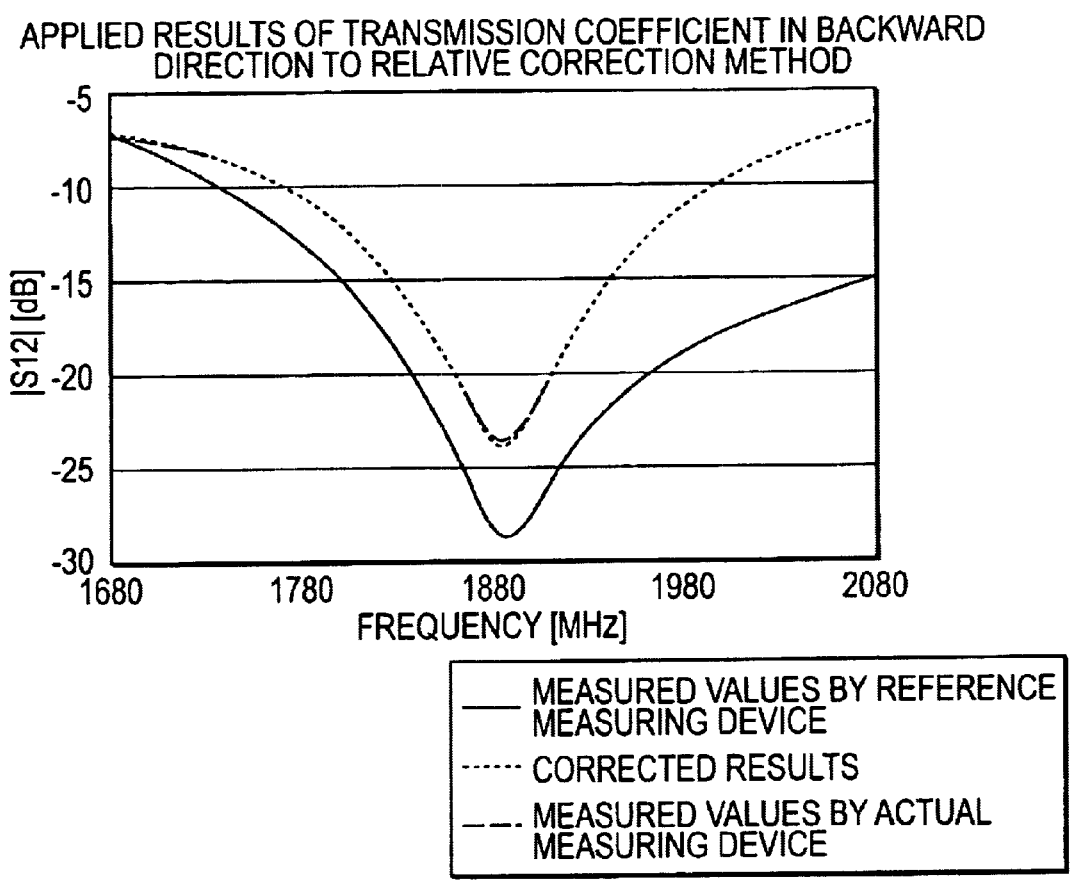
FIG. 10 is a graph showing correction data obtained by performing the measurement error correction method according to the first embodiment of the present invention.

The specific results corrected by the two-port correction method according to this embodiment from the electrical characteristics of the target electronic component 11A (two-port) measured by the actual measuring system 2 (actual measurement fixture 5B) will be described with reference to FIGS. 8 to 10.

As the reference measurement fixture 5A, a so-called substrate for quality assurance to users having conductive rubber putted thereon is used. As the actual measurement fixture 5B, the reference measurement fixture 5A having a two pF capacitor attached thereto to purposely cause a large error factor therein is used. As the correction-data acquisition sample 11B, an isolator package having a chip resistor attached thereto is used. FIG. 8 shows the corrected results of the scattering coefficient in the forward direction; FIG. 9 is a partial enlarged drawing of the corrected results of the scattering coefficient in the forward direction; and FIG. 10 shows the corrected results of the scattering coefficient in the backward direction.

As understood from these drawings, if the correction method according to this embodiment is performed, the large measurement difference between the actual measuring system 2 (the measurement fixture 5B) and the reference measuring system 1 (the measurement fixture 5A) is substantially precisely corrected. That is, the corrected results are obtained by the relative correction method based on the actual, and if the corrected results agree with "the value measured by the actual measurement", it is shown that the correction is normally performed, and which is practically performed. In referring to FIG. 9, which is partial enlarged, it is apparent to be substantially precisely corrected.

The following point in the measurement data also is noteworthy. That is, although the correction-data acquisition samples 11B are apparently nondirectional devices because they are entirely made of resistors, the relative correction of the target electronic component 11A being apparently directional such as an isolator can be performed in high accuracy. This comes from the following reason. Since S21 and S12 in the equation (A9) are not in the temporary connecting relationship, the relative correction coefficients can be entirely identified without using the directional device as the correction-data acquisition sample 11B. Thereby, the relative correction of the target electronic component 11A made of the nondirectional device can also be performed in high accuracy.

This has the following advantage. That is, manufacturing the correction-data acquisition sample 11B made of the directional device with a broad band is extremely difficult, so that it is very important in practically performing the relative correction method not to require such a correction-data acquisition sample 11B. However, since the target electronic component 11A is liable to be weak to measurement errors, when the target electronic component 11A has a high directional character such as an isolator, one of the devices itself may be practically used as the correction-data acquisition sample 11B.

The above description is of the case in which this embodiment is performed in the unbalanced two-port measurement system. Next, is the case in which this embodiment is performed in an unbalanced one-port measurement system will be described.

Figure 11:
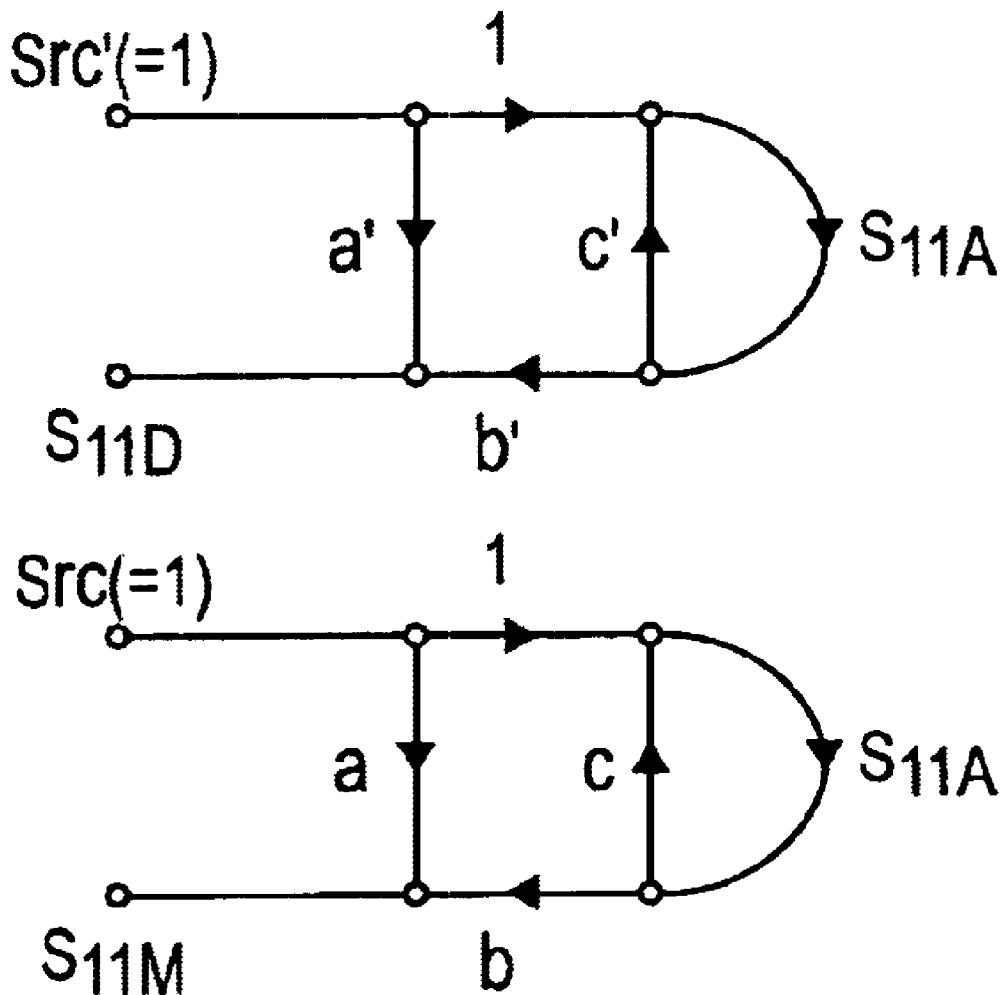
FIG. 11 is a drawing of an example of a signal transfer pattern (error model) for use in performing a measurement error correction method according to a second embodiment of the present invention.

The error factors in the measurement systems (the reference measuring system 1 and the actual measuring system 2) are modeled by the signal transfer pattern shown in FIG. 11. The signal transfer pattern shown in FIG. 11 is the same as a generally used one-port error model.

In this signal transfer pattern, if the error factors are entirely identified, the scattering coefficient true value $S_{11A}$ of the correction-data acquisition samples 11B can be obtained from the measured value $S_{11M}$ thereof according to the following theoretical equations (A10a) and (A10b). The theoretical equations (A10a) and (A10b) can be derived from the signal transfer pattern shown in FIG. 11.

[Numerical Formula 23]

$$S_{11A} = \frac{S_{11M} - a}{cS_{11M} + b - ac} \quad (A10a)$$

$$S_{11A} = \frac{S_{11D} - a'}{c'S_{11D} + b' - a'c'} \quad (A10b)$$

When the correction-data acquisition samples 11B, in which the scattering coefficient true value is ($S_{11A}$), is measured, the scattering coefficient $S_{11D}$ is measured in the reference measuring system 1 and the scattering coefficient $S_{11M}$ is measured in the actual measuring system 2.

It is practically impossible to specifically know the scattering coefficient true value $S_{11A}$ of the correction-data acquisition samples 11B and error factor values of the reference measuring system 1 (the measurement fixture 5A) and the actual measuring system 2 (the measurement fixture 5B). On the other hand, the value $S_{11D}$ measured by the reference measuring system 1 and the value $S_{11M}$ measured by the actual measuring system 2 can be known by actual measurement.

It is an object of the relative correction method according to this embodiment to obtain the value measured by the reference measuring system 1 from the value measured by the actual measuring system 2.

In comparison of the theoretical equation (A10a) with the theoretical equation (A10b), the left-side members are the same scattering coefficient true value $S_{11A}$. Therefore, the following equation (A11) can be derived from these theoretical equations (A10a) and (A10b).

[Numerical Formula 24]

$$\frac{S_{11D} - a'}{c'S_{11D} + b' - a'c'} = \frac{S_{11M} - a}{cS_{11M} + b - ac} \quad (A11)$$

Furthermore, by rearranging the equation (A11) with respect to $S_{11D}$, the following interrelation equation (A12) can be derived. The interrelation equation (A12) is an equation showing the relationship between the results measured by the actual measuring system 2 and the results measured by the reference measuring system 1.

[Numerical Formula 25]

$$S_{11D} = \frac{(a'c' - a'c - b')S_{11M} - aa'c' + aa'c + ab' - a'b}{(c' - c)S_{11M} - ac' + ac - b} \quad (A12)$$

In the interrelation equation (A12), if the error factors of the reference measuring system 1 (the measurement fixture 5A) are values of a measuring system entirely without errors, i.e., a'=0, b'=0, and c'=0, the following equation (A13) is derived from the interrelation equation (A12). This equation (A13) agrees with the theoretical equations (A10a) and (A10b). It is understood from the above that the generally used one-port correction method corresponds to a specific case (the reference fixture is ideal) of the relative correction method according to this embodiment.

[Numerical Formula 26]

$$S_{11D} = \frac{S_{11M} - a}{cS_{11M} - ac + b} \quad (A13)$$

At the sight of the interrelation equation (A12) in detail, (−aa'c'+aa'c+ab'+a'b), (c−c'), and (−ac'+ac−b), which constitute the interrelation equation (A12), can be substituted for one undetermined coefficient, respectively. Then, if these sections are substituted for undetermined coefficients α, β, and χ, respectively, the interrelation equation (A12) can be rearranged to the following interrelation equation (A14).

[Numerical Formula 27]

$$S_{11D} = \frac{S_{11M} + \alpha}{\beta S_{11M} + \gamma} \quad (A14)$$

Furthermore, since three unknown quantities α, β, and χ exist in the interrelation equation (A14), three correction-data acquisition samples are prepared to measure the respective characteristics, so that these quantities can be identified. Then, using the same codes as those of the two-port allows leading the interrelation equations (A15a to A15c).

[Numerical Formula 28]

$$\alpha = \frac{\begin{array}{c}-(S_{11N1}(S_{11M1}(S_{11M3}S_{11N2} - S_{11M2}S_{11N3}) + \\ S_{11M2}S_{11M3}S_{11N3} - S_{11M2}S_{11M3}S_{11N2}) + \\ S_{11M1}S_{11N2}(S_{11M2}S_{11N3} - S_{11M3}S_{11N3}))\end{array}}{\begin{array}{c}S_{11N1}(S_{11M2}S_{11N3} + S_{11M1}(S_{11N2} - S_{11N3}) - \\ S_{11M2}S_{11N2}) + S_{11N2}(S_{11M2}S_{11N3} - S_{11M3}S_{11N3})\end{array}} \quad (A15a)$$

$$\beta = \frac{\begin{array}{c}-(S_{11M1}(S_{11N3} - S_{11N2}) - S_{11M2}S_{11N3} + \\ S_{11M3}S_{11N2} + (S_{11M2} - S_{11M3})S_{11N1})\end{array}}{\begin{array}{c}S_{11N1}(S_{11M2}S_{11N3} + S_{11M1}(S_{11N2} - S_{11N3}) - \\ S_{11M2}S_{11N2}) + S_{11N2}(S_{11M2}S_{11N3} - S_{11M3}S_{11N3})\end{array}} \quad (A15b)$$

$$\gamma = \frac{\begin{array}{c}S_{11M1}(S_{11M3}S_{11D3} - S_{11M2}S_{11D2}) - S_{11M2}S_{11M3}S_{11D3} + \\ S_{11M2}S_{11M3}S_{11D2} + S_{11M1}S_{11D1}(S_{11M2} - S_{11M3})\end{array}}{\begin{array}{c}S_{11D1}(S_{11M2}S_{11D3} + S_{11M1}(S_{11D2} - S_{11D3}) - \\ S_{11M2}S_{11D2}) + S_{11D2}(S_{11M2}S_{11D3} - S_{11M3}S_{11D3})\end{array}} \quad (A15c)$$

On the basis of the interrelation equations (A15a to A15c), if three correction-data acquisition samples $11B_{1\ to\ 3}$ are prepared to measure the respective characteristics, undetermined coefficients (relative correction coefficients) α, β, and χ can be identified.

The practical correcting operation of measured values performed after identification of the undetermined coefficients as described above is the same as in the correcting operation of the two-port measuring system, so that the description thereof is omitted.

The specific results of electrical characteristics of the target electronic component 11A (one-port) measured by the actual measuring system 2 (the measurement fixture 5B) and further corrected by the two-port relative correction method according to this embodiment will be described with reference to FIG. 12.

Figure 12:
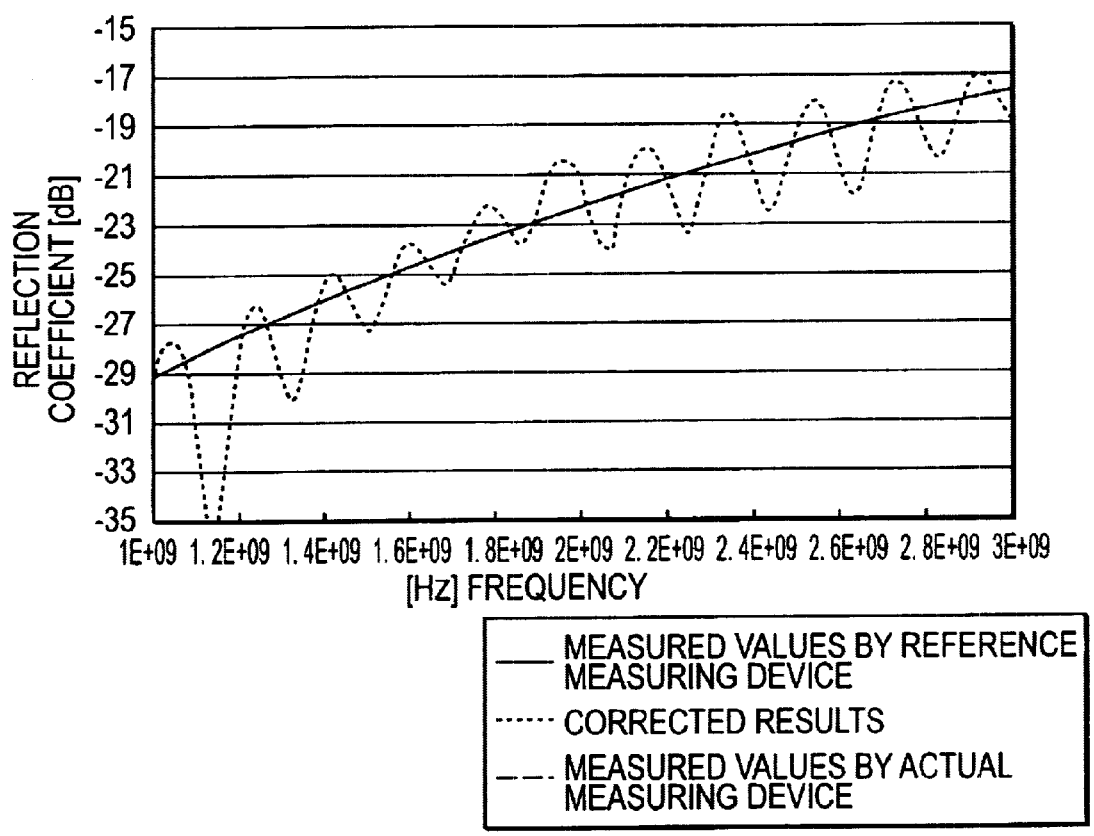
FIG. 12 is a graph showing correction data obtained by performing the measurement error correction method according to the first embodiment of the present invention.

As is apparent from FIG. 12, according to the correction method of this embodiment, even in a one-port electronic component, it is understood that a large measured value difference between the actual measuring system 2 (the actual measurement fixture 5B) and the reference measuring system 1 (the reference measurement fixture 5A) is substantially precisely corrected. That is, the corrected results are obtained from the values measured by the actual measuring system shown in the graph. If the corrected results agree with the values measured by the reference measuring system, the correction is normally performed, and it is performed in that way in fact.

The correction method of measured results according to this embodiment described above has the following advantages. That is, in assuring characteristics of electronic components by manufacturers of the components, the electrical characteristics are assured on the basis of the results measured by a measuring system arranged in the manufacturer. However, it is not necessarily to have the same results when the electrical characteristics are measured by a measuring system arranged in a user who has bought the components. Therefore, the characteristics assured by the manufacturer cannot be confirmed, resulting in uncertain assurance without repeatability.

Whereas, when the measuring system in the manufacturer side is to be the reference measuring system while the measuring system in the user side is to be the actual measuring system, if the correction method of measurement errors according to this embodiment is performed, the electrical characteristics assumed to be the same as the measured results in the manufacturer side can be calculated by the user on the basis of the results measured by the measuring system in the user side. Thereby, the assurance of electronic components by the manufacturer can be repeated and sufficiently secured, enabling the assurance to be received by the user.

Moreover, the correction described above can be performed without strict inspection of the actual measuring system 2 (characteristics of the measurement fixture 5B of the actual measuring system 2 are adjusted to be identical to those of the measurement fixture 5A of the reference measuring system 1, for example.), so that the cost required for the measurement can be suppressed that much.

Furthermore, in the user side, many automatic measuring and sorting machines installed in a mass production line can also be selected as the actual measuring systems, so that the cost required for the measurement (defective-component sorting cost, in this case) can be further suppressed that much, while the measuring time is reduced.

Moreover, not only measurement errors due to the measurement fixtures 5A and 5B but also measurement errors of the entire actual measuring system can be simultaneously corrected, so that calibration such as the full two-port correction method need not be performed in the actual measuring system 2, further suppressing measuring cost that much.

Furthermore, in the measuring system according to this embodiment, even when the actual measuring system 5B is used, in which the performance for being incorporated into an automatic measuring and sorting machine and the long life are given priority over stabilizing measurement characteristics, measured results cannot be affected therefrom, so that the cost required for the measurement can be further suppressed that much, while the measuring time is reduced.

Second Embodiment

According to a second embodiment, a measurement error correction method is incorporated in the present invention, in which selecting a surface-mount SAW filter as a target electronic component, electrical characteristics of the SAW filter are measured by a measuring system having a network analyzer. According to the second embodiment, measured values are corrected by an approximate-relative correction method that is only different from the first embodiment. Therefore, arrangements of the measuring systems 1 and 2 and measurement fixtures 5A and 5B are the same as those of the first embodiment, so that device arrangements of the first embodiment are correspondingly applied to this embodiment and the description thereof is omitted.

First, a plurality of (five, for example) correction-data acquisition samples $11B_{1\ to\ 5}$ are prepared. The prepared five correction-data acquisition samples $11B_{1\ to\ 5}$ are mounted on the reference measuring system 1. Then, electrical characteristics of the correction-data acquisition samples $11B_{1\ to\ 5}$ are measured for each frequency point. The SAW filter corresponding to the correction-data acquisition samples $11B_{1\ to\ 5}$ is a high-frequency electronic component, and the electrical characteristic to be measured here is an S parameter comprising a scattering coefficient $S_{11}$ in the forward direction, scattering coefficient $S_{21}$ in the forward direction, scattering coefficient $S_{12}$ in the backward direction, and scattering coefficient $S_{22}$ in the backward direction.

The measured results ($S_{11}^{n*}$, $S_{21}^{n*}$, $S_{12}^{n*}$, and $S_{22}^{n*}$: n: natural numbers of 1 to 5) of the S parameter of the correction-data acquisition samples $11B_{1\ to\ 5}$ on the reference measuring system 1 are input in the actual measuring system 2 via a data input unit thereof (not shown) in advance. The input results ($S_{11}^{n*}$, $S_{21}^{n*}$, $S_{12}^{n*}$, and $S_{22}^{n*}$) measured by the reference measuring system 1 are stored in the memory 23 via the control unit body 22.

On the other hand, similarly, the correction-data acquisition samples $11B_{1\ to\ 5}$ are also mounted on the actual measuring system 2. Then, electrical characteristics of the correction-data acquisition samples $11B_{1\ to\ 5}$ are measured for each frequency point.

The measured results ($S_{11}^{nM}$, $S_{21}^{nM}$, $S_{12}^{nM}$, and $S_{22}^{nM}$: n: natural numbers of 1 to 5) of the S parameter of the correction-data acquisition samples $11B_{1\ to\ 5}$ on the actual measuring system 2 are input in the interrelating formula computing means 24 via the control unit body 22.

After the results ($S_{11}^{nM}$, $S_{21}^{nM}$, $S_{12}^{nM}$, and $S_{22}^{nM}$) of the correction-data acquisition samples $11B_{1\ to\ 5}$ measured by the actual measuring system 2 are input, the interrelating formula computing means 24 reads out the results ($S_{11}^{n*}$, $S_{21}^{n*}$, $S_{12}^{n*}$, and $S_{22}^{n*}$) measured by the reference measuring system 1 from the memory 23 via the control unit body 22.

The interrelating formula computing means 24 stores an interrelation equation approximately showing the relationship between the results measured by the actual measuring system and the results measured by the reference measuring system and undetermined-coefficient computing equations. The interrelation equation is formed of the following linear expression (B2) and comprises undetermined coefficients ($a_m$, $b_m$, $e_m$, and $d_m$: m; integers of 0 to 4). The undetermined-coefficient computing equations are formed of the following equations (B1a) to (B1d). The undetermined-coefficient computing equations (B1a) to (B1d) are for computing undetermined coefficients ($a_m$, $b_m$, $c_m$, and $d_m$: m; integers of 0 to 4) and are generated based on the interrelation equation (B2).

[Numerical Formula 1]

$$\begin{pmatrix} S_{11}^{1*} \\ S_{11}^{2*} \\ S_{11}^{3*} \\ S_{11}^{4*} \\ S_{11}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} a_1 \\ a_2 \\ a_3 \\ a_4 \\ a_0 \end{pmatrix} \quad \text{B1a}$$

$$\begin{pmatrix} S_{21}^{1*} \\ S_{21}^{2*} \\ S_{21}^{3*} \\ S_{21}^{4*} \\ S_{21}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} b_1 \\ b_2 \\ b_3 \\ b_4 \\ b_0 \end{pmatrix} \quad \text{B1b}$$

$$\begin{pmatrix} S_{12}^{1*} \\ S_{12}^{2*} \\ S_{12}^{3*} \\ S_{12}^{4*} \\ S_{12}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} c_1 \\ c_2 \\ c_3 \\ c_4 \\ c_0 \end{pmatrix} \quad \text{B1c}$$

$$\begin{pmatrix} S_{22}^{1*} \\ S_{22}^{2*} \\ S_{22}^{3*} \\ S_{22}^{4*} \\ S_{22}^{5*} \end{pmatrix} = \begin{pmatrix} S_{11}^{1M} & S_{21}^{1M} & S_{12}^{1M} & S_{22}^{1M} & 1 \\ S_{11}^{2M} & S_{21}^{2M} & S_{12}^{2M} & S_{22}^{2M} & 1 \\ S_{11}^{3M} & S_{21}^{3M} & S_{12}^{3M} & S_{22}^{3M} & 1 \\ S_{11}^{4M} & S_{21}^{4M} & S_{12}^{4M} & S_{22}^{4M} & 1 \\ S_{11}^{5M} & S_{21}^{5M} & S_{12}^{5M} & S_{22}^{5M} & 1 \end{pmatrix} \begin{pmatrix} d_1 \\ d_2 \\ d_3 \\ d_4 \\ d_0 \end{pmatrix} \quad \text{B1d}$$

[Numerical Formula 2]

$$\begin{pmatrix} S_{11}^* \\ S_{21}^* \\ S_{12}^* \\ S_{22}^* \end{pmatrix} = \begin{pmatrix} a_1 & a_2 & a_3 & a_4 \\ b_1 & b_2 & b_3 & b_4 \\ c_1 & c_2 & c_3 & c_4 \\ d_1 & d_2 & d_3 & d_4 \end{pmatrix} \begin{pmatrix} S_{11}^M \\ S_{21}^M \\ S_{12}^M \\ S_{22}^M \end{pmatrix} + \begin{pmatrix} a_0 \\ b_0 \\ c_0 \\ d_0 \end{pmatrix} \quad \text{B2}$$

$S_{11}^*$, $S_{21}^*$, $S_{12}^*$, and $S_{22}^*$: the S parameter of the target electronic component 11A assumed to be obtained by the reference measuring system 1.
$S_{11}^M$, $S_{21}^M$, $S_{12}^M$, and $S_{22}^M$: the S parameter of the target electronic component 11A measured by the actual measuring system 2.

The interrelating formula computing means 24 determines the undetermined coefficients ($a_m$, $b_m$, $c_m$, and $d_m$: m; integers of 0 to 4) by substituting both measured results, which are the S parameter ($S_{11}^{nM}$, $S_{21}^{nM}$, $S_{12}^{nM}$, and $S_{22}^{nM}$) and the S parameter ($S_{11}^{n*}$, $S_{21}^{n*}$, $S_{12}^{n*}$, and $S_{22}^{n*}$), in the undetermined-coefficient computing equations (B1a) to (B1d).

The interrelating formula computing means 24 determines the interrelation equation between the results measured by the actual measuring system 2 and the results measured by the reference measuring system 1 by inserting the identified undetermined coefficients ($a_m$, $b_m$, $c_m$, and $d_m$) into the interrelation equation (B2). The interrelation equation is determined for each frequency point. The determined interrelation equation is input and recorded in the memory 23 by the interrelating formula computing means 24 via the control unit body 22.

After the preliminary process described above, electrical characteristics (the S parameter $S_{11}^M$, $S_{21}^M$, $S_{12}^M$, and $S_{22}^M$) of the target electronic component 11A are measured by the network analyzer body 20 in the actual measuring system 2. The measured results of the target electronic component 11A are input in the correcting means 25 via the control unit body 22.

After the measured results of the target electronic component 11A are input, the correcting means 25 reads out the interrelation equations from the memory 23 via the control unit body 22. The correcting means 25 substitutes the electrical characteristics (the S parameter $S_{11}^M$, $S_{21}^M$, $S_{12}^M$, and $S_{22}^M$), which are the measured results of the target electronic component 11A, into the interrelation equations so as to be computed. Thereby, the correcting means 25 corrects the measured results (electrical characteristics) of the target electronic component 11A on the actual measuring system 2 to the electrical characteristics ($S_{11}^*$, $S_{21}^*$, $S_{12}^*$, and $S_{22}^*$), which are assumed to be obtained when being measured by the reference measuring system 1. The correcting means 25 outputs the computed corrected values outsides via the control unit body 22. The output may be displayed on a display unit (not shown) or may be output by a data output unit (not shown) as data.

In addition, this computation process, as described above, may be performed by the control unit 21 built in the network analyzer 3B, or the measured results may be output to an outside computer connected to the network analyzer 3B so as to allow the outside computer to perform the computation process.

The correction method of measured results according to this embodiment has the following advantages. That is, in assuring characteristics of electronic components by manufacturers of the components, the electrical characteristics are assured on the basis of the results measured by a measuring system arranged in the manufacturer. However, it is not necessarily to have the same results when the electrical characteristics are measured by a measuring system arranged in a user who has bought the components. Therefore, the characteristics assured by the manufacturer cannot be confirmed, resulting in uncertain assurance without repeatability.

Whereas, when the measuring system in the manufacturer side is to be the reference measuring system while the measuring system in the user side is to be the actual measuring system, if the correction method of measurement errors according to the embodiment is performed, the electrical characteristics assumed to be the same as the measured results in the manufacturer side can be calculated by the user on the basis of the results measured by the measuring system in the user side. Thereby, the assurance of electronic components by the manufacturer can be repeated and sufficiently secured, enabling the assurance to be received by the user.

Moreover, the correction described above can be performed without strict inspection of the actual measuring system 2 (characteristics of the measurement fixture 5B of the actual measuring system 2 are adjusted to be identical to those of the measurement fixture 5A of the reference measuring system 1, for example.), so that the cost required for the measurement can be suppressed that much.

Furthermore, in the user side, many automatic measuring and sorting machines installed in a mass production line can also be selected as the actual measuring systems, so that the cost required for the measurement (defective-component sorting cost, in this case) can be further suppressed that much, while the measuring time is reduced.

Moreover, not only measurement errors due to the measurement fixtures 5A and 5B but also measurement errors of the entire actual measuring system can be simultaneously corrected, so that calibration such as the full two-port correction method need not be performed in the actual measuring system 2, further suppressing measuring cost that much.

Furthermore, in the measuring system according to this embodiment, even when the actual measuring system 5B is used, in which the performance for being incorporated into an automatic measuring and sorting machine and the long life are given priority over stabilizing measurement characteristics, measured results cannot be affected therefrom, so that the cost required for the measurement can be further suppressed that much, while the measuring time is reduced.

Furthermore, in the measuring system (the approximate-relative correction method) according to this embodiment, nonlinear errors can be corrected.

Third Embodiment

The device arrangement for performing measured error correction method according to a third embodiment is basically the same as that of the first and second embodiments, so that like reference characters designate like elements common to each embodiment, and the description thereof is omitted.

According to the embodiment, although the same correction method as that of the second embodiment is performed, the computing method for performing correction is slightly different from that of the second embodiment. According to this embodiment, 15 samples $11B_{1 \ to \ 15}$ with electrical characteristics, which are generated by measurement operation of the measuring system and being different from each other, are prepared as the correction-data acquisition samples 11B.

The prepared 15 correction-data acquisition sample $11B_{1 \ to \ 15}$ are mounted on the reference measuring system 1 and the actual measuring system 2 so as to measure the S parameter.

The interrelating formula computing means 24 stores interrelation equations approximately showing the relationship between the results measured by the actual measuring system and the results measured by the reference measuring system and undetermined-coefficient computing equations. The interrelation equations are formed of the following quadratic expressions (C2a) to (c2d) and comprises undetermined coefficients ($a_q$, $b_q$, $C_q$, and $d_q$: q; integers of 0 to 14). The undetermined-coefficient computing equations are formed of the following equations (B1a) to (B1d). The undetermined-coefficient computing equations (C1a) to (C1d) are for computing undetermined coefficients ($a_q$, $b_q$, $c_q$, and $d_q$: q; integers of 0 to 14) and are generated based on the interrelation equations (C2a) to (c2d).

[Numerical Formula 3]

$$\begin{pmatrix} S_{11}^{1*} \\ S_{11}^{2*} \\ S_{11}^{3*} \\ S_{11}^{4*} \\ S_{11}^{5*} \\ S_{11}^{6*} \\ S_{11}^{7*} \\ S_{11}^{8*} \\ S_{11}^{9*} \\ S_{11}^{10*} \\ S_{11}^{11*} \\ S_{11}^{12*} \\ S_{11}^{13*} \\ S_{11}^{14*} \\ S_{11}^{15*} \end{pmatrix} = \begin{pmatrix} S_{11}^{1M} & S_{21}^{1M} & S_{12}^{1M} & S_{22}^{1M} & (S_{11}^{1M})^2 & (S_{21}^{1M})^2 & (S_{12}^{1M})^2 & (S_{22}^{1M})^2 & S_{11}^{1M}S_{21}^{1M} & S_{11}^{1M}S_{12}^{1M} & S_{11}^{1M}S_{22}^{1M} & S_{21}^{1M}S_{12}^{1M} & S_{21}^{1M}S_{22}^{1M} & S_{12}^{1M}S_{22}^{1M} & 1 \\ S_{11}^{2M} & S_{21}^{2M} & S_{12}^{2M} & S_{22}^{2M} & (S_{11}^{2M})^2 & (S_{21}^{2M})^2 & (S_{12}^{2M})^2 & (S_{22}^{2M})^2 & S_{11}^{2M}S_{21}^{2M} & S_{11}^{2M}S_{12}^{2M} & S_{11}^{2M}S_{22}^{2M} & S_{21}^{2M}S_{12}^{2M} & S_{21}^{2M}S_{22}^{2M} & S_{12}^{2M}S_{22}^{2M} & 1 \\ \vdots & \vdots & \vdots & \vdots & \vdots & \vdots & \vdots & \vdots & \vdots & \vdots & \vdots & \vdots & \vdots & \vdots & \vdots \\ S_{11}^{15M} & S_{21}^{15M} & S_{12}^{15M} & S_{22}^{15M} & (S_{11}^{15M})^2 & (S_{21}^{15M})^2 & (S_{12}^{15M})^2 & (S_{22}^{15M})^2 & S_{11}^{15M}S_{21}^{15M} & S_{11}^{15M}S_{12}^{15M} & S_{11}^{15M}S_{22}^{15M} & S_{21}^{15M}S_{12}^{15M} & S_{21}^{15M}S_{22}^{15M} & S_{12}^{15M}S_{22}^{15M} & 1 \end{pmatrix} \begin{pmatrix} a_1 \\ a_2 \\ a_3 \\ a_4 \\ a_5 \\ a_6 \\ a_7 \\ a_8 \\ a_9 \\ a_{10} \\ a_{11} \\ a_{12} \\ a_{13} \\ a_{14} \\ a_0 \end{pmatrix} \quad C1a$$

[Numerical Formula 4]

$$\begin{pmatrix} S_{21}^{1*} \\ S_{21}^{2*} \\ S_{21}^{3*} \\ S_{21}^{4*} \\ S_{21}^{5*} \\ S_{21}^{6*} \\ S_{21}^{7*} \\ S_{21}^{8*} \\ S_{21}^{9*} \\ S_{21}^{10*} \\ S_{21}^{11*} \\ S_{21}^{12*} \\ S_{21}^{13*} \\ S_{21}^{14*} \\ S_{21}^{15*} \end{pmatrix} = \begin{pmatrix} S_{11}^{1M} & S_{21}^{1M} & S_{12}^{1M} & S_{22}^{1M} & (S_{11}^{1M})^2 & (S_{21}^{1M})^2 & (S_{12}^{1M})^2 & (S_{22}^{1M})^2 & S_{11}^{1M}S_{21}^{1M} & S_{11}^{1M}S_{12}^{1M} & S_{11}^{1M}S_{22}^{1M} & S_{21}^{1M}S_{12}^{1M} & S_{21}^{1M}S_{22}^{1M} & S_{12}^{1M}S_{22}^{1M} & 1 \\ S_{11}^{2M} & S_{21}^{2M} & S_{12}^{2M} & S_{22}^{2M} & (S_{11}^{2M})^2 & (S_{21}^{2M})^2 & (S_{12}^{2M})^2 & (S_{22}^{2M})^2 & S_{11}^{2M}S_{21}^{2M} & S_{11}^{2M}S_{12}^{2M} & S_{11}^{2M}S_{22}^{2M} & S_{21}^{2M}S_{12}^{2M} & S_{21}^{2M}S_{22}^{2M} & S_{12}^{2M}S_{22}^{2M} & 1 \\ \vdots & \vdots & \vdots & \vdots & \vdots & \vdots & \vdots & \vdots & \vdots & \vdots & \vdots & \vdots & \vdots & \vdots & \vdots \\ S_{11}^{15M} & S_{21}^{15M} & S_{12}^{15M} & S_{22}^{15M} & (S_{11}^{15M})^2 & (S_{21}^{15M})^2 & (S_{12}^{15M})^2 & (S_{22}^{15M})^2 & S_{11}^{15M}S_{21}^{15M} & S_{11}^{15M}S_{12}^{15M} & S_{11}^{15M}S_{22}^{15M} & S_{21}^{15M}S_{12}^{15M} & S_{21}^{15M}S_{22}^{15M} & S_{12}^{15M}S_{22}^{15M} & 1 \end{pmatrix} \begin{pmatrix} b_1 \\ b_2 \\ b_3 \\ b_4 \\ b_5 \\ b_6 \\ b_7 \\ b_8 \\ b_9 \\ b_{10} \\ b_{11} \\ b_{12} \\ b_{13} \\ b_{14} \\ b_0 \end{pmatrix} \quad C1b$$

-continued

[Numerical Formula 5]

$$\begin{pmatrix} s_{12}^{1*} \\ s_{12}^{2*} \\ s_{12}^{3*} \\ s_{12}^{4*} \\ s_{12}^{5*} \\ s_{12}^{6*} \\ s_{12}^{7*} \\ s_{12}^{8*} \\ s_{12}^{9*} \\ s_{12}^{10*} \\ s_{12}^{11*} \\ s_{12}^{12*} \\ s_{12}^{13*} \\ s_{12}^{14*} \\ s_{12}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \begin{pmatrix} c_1 \\ c_2 \\ c_3 \\ c_4 \\ c_5 \\ c_6 \\ c_7 \\ c_8 \\ c_9 \\ c_{10} \\ c_{11} \\ c_{12} \\ c_{13} \\ c_{14} \\ c_0 \end{pmatrix} \quad C1c$$

[Numerical Formula 6]

$$\begin{pmatrix} s_{22}^{1*} \\ s_{22}^{2*} \\ s_{22}^{3*} \\ s_{22}^{4*} \\ s_{22}^{5*} \\ s_{22}^{6*} \\ s_{22}^{7*} \\ s_{22}^{8*} \\ s_{22}^{9*} \\ s_{22}^{10*} \\ s_{22}^{11*} \\ s_{22}^{12*} \\ s_{22}^{13*} \\ s_{22}^{14*} \\ s_{22}^{15*} \end{pmatrix} = \begin{pmatrix} s_{11}^{1M} & s_{21}^{1M} & s_{12}^{1M} & s_{22}^{1M} & (s_{11}^{1M})^2 & (s_{21}^{1M})^2 & (s_{12}^{1M})^2 & (s_{22}^{1M})^2 & s_{11}^{1M}s_{21}^{1M} & s_{11}^{1M}s_{12}^{1M} & s_{11}^{1M}s_{22}^{1M} & s_{21}^{1M}s_{12}^{1M} & s_{21}^{1M}s_{22}^{1M} & s_{12}^{1M}s_{22}^{1M} & 1 \\ s_{11}^{2M} & s_{21}^{2M} & s_{12}^{2M} & s_{22}^{2M} & (s_{11}^{2M})^2 & (s_{21}^{2M})^2 & (s_{12}^{2M})^2 & (s_{22}^{2M})^2 & s_{11}^{2M}s_{21}^{2M} & s_{11}^{2M}s_{12}^{2M} & s_{11}^{2M}s_{22}^{2M} & s_{21}^{2M}s_{12}^{2M} & s_{21}^{2M}s_{22}^{2M} & s_{12}^{2M}s_{22}^{2M} & 1 \\ s_{11}^{3M} & s_{21}^{3M} & s_{12}^{3M} & s_{22}^{3M} & (s_{11}^{3M})^2 & (s_{21}^{3M})^2 & (s_{12}^{3M})^2 & (s_{22}^{3M})^2 & s_{11}^{3M}s_{21}^{3M} & s_{11}^{3M}s_{12}^{3M} & s_{11}^{3M}s_{22}^{3M} & s_{21}^{3M}s_{12}^{3M} & s_{21}^{3M}s_{22}^{3M} & s_{12}^{3M}s_{22}^{3M} & 1 \\ s_{11}^{4M} & s_{21}^{4M} & s_{12}^{4M} & s_{22}^{4M} & (s_{11}^{4M})^2 & (s_{21}^{4M})^2 & (s_{12}^{4M})^2 & (s_{22}^{4M})^2 & s_{11}^{4M}s_{21}^{4M} & s_{11}^{4M}s_{12}^{4M} & s_{11}^{4M}s_{22}^{4M} & s_{21}^{4M}s_{12}^{4M} & s_{21}^{4M}s_{22}^{4M} & s_{12}^{4M}s_{22}^{4M} & 1 \\ s_{11}^{5M} & s_{21}^{5M} & s_{12}^{5M} & s_{22}^{5M} & (s_{11}^{5M})^2 & (s_{21}^{5M})^2 & (s_{12}^{5M})^2 & (s_{22}^{5M})^2 & s_{11}^{5M}s_{21}^{5M} & s_{11}^{5M}s_{12}^{5M} & s_{11}^{5M}s_{22}^{5M} & s_{21}^{5M}s_{12}^{5M} & s_{21}^{5M}s_{22}^{5M} & s_{12}^{5M}s_{22}^{5M} & 1 \\ s_{11}^{6M} & s_{21}^{6M} & s_{12}^{6M} & s_{22}^{6M} & (s_{11}^{6M})^2 & (s_{21}^{6M})^2 & (s_{12}^{6M})^2 & (s_{22}^{6M})^2 & s_{11}^{6M}s_{21}^{6M} & s_{11}^{6M}s_{12}^{6M} & s_{11}^{6M}s_{22}^{6M} & s_{21}^{6M}s_{12}^{6M} & s_{21}^{6M}s_{22}^{6M} & s_{12}^{6M}s_{22}^{6M} & 1 \\ s_{11}^{7M} & s_{21}^{7M} & s_{12}^{7M} & s_{22}^{7M} & (s_{11}^{7M})^2 & (s_{21}^{7M})^2 & (s_{12}^{7M})^2 & (s_{22}^{7M})^2 & s_{11}^{7M}s_{21}^{7M} & s_{11}^{7M}s_{12}^{7M} & s_{11}^{7M}s_{22}^{7M} & s_{21}^{7M}s_{12}^{7M} & s_{21}^{7M}s_{22}^{7M} & s_{12}^{7M}s_{22}^{7M} & 1 \\ s_{11}^{8M} & s_{21}^{8M} & s_{12}^{8M} & s_{22}^{8M} & (s_{11}^{8M})^2 & (s_{21}^{8M})^2 & (s_{12}^{8M})^2 & (s_{22}^{8M})^2 & s_{11}^{8M}s_{21}^{8M} & s_{11}^{8M}s_{12}^{8M} & s_{11}^{8M}s_{22}^{8M} & s_{21}^{8M}s_{12}^{8M} & s_{21}^{8M}s_{22}^{8M} & s_{12}^{8M}s_{22}^{8M} & 1 \\ s_{11}^{9M} & s_{21}^{9M} & s_{12}^{9M} & s_{22}^{9M} & (s_{11}^{9M})^2 & (s_{21}^{9M})^2 & (s_{12}^{9M})^2 & (s_{22}^{9M})^2 & s_{11}^{9M}s_{21}^{9M} & s_{11}^{9M}s_{12}^{9M} & s_{11}^{9M}s_{22}^{9M} & s_{21}^{9M}s_{12}^{9M} & s_{21}^{9M}s_{22}^{9M} & s_{12}^{9M}s_{22}^{9M} & 1 \\ s_{11}^{10M} & s_{21}^{10M} & s_{12}^{10M} & s_{22}^{10M} & (s_{11}^{10M})^2 & (s_{21}^{10M})^2 & (s_{12}^{10M})^2 & (s_{22}^{10M})^2 & s_{11}^{10M}s_{21}^{10M} & s_{11}^{10M}s_{12}^{10M} & s_{11}^{10M}s_{22}^{10M} & s_{21}^{10M}s_{12}^{10M} & s_{21}^{10M}s_{22}^{10M} & s_{12}^{10M}s_{22}^{10M} & 1 \\ s_{11}^{11M} & s_{21}^{11M} & s_{12}^{11M} & s_{22}^{11M} & (s_{11}^{11M})^2 & (s_{21}^{11M})^2 & (s_{12}^{11M})^2 & (s_{22}^{11M})^2 & s_{11}^{11M}s_{21}^{11M} & s_{11}^{11M}s_{12}^{11M} & s_{11}^{11M}s_{22}^{11M} & s_{21}^{11M}s_{12}^{11M} & s_{21}^{11M}s_{22}^{11M} & s_{12}^{11M}s_{22}^{11M} & 1 \\ s_{11}^{12M} & s_{21}^{12M} & s_{12}^{12M} & s_{22}^{12M} & (s_{11}^{12M})^2 & (s_{21}^{12M})^2 & (s_{12}^{12M})^2 & (s_{22}^{12M})^2 & s_{11}^{12M}s_{21}^{12M} & s_{11}^{12M}s_{12}^{12M} & s_{11}^{12M}s_{22}^{12M} & s_{21}^{12M}s_{12}^{12M} & s_{21}^{12M}s_{22}^{12M} & s_{12}^{12M}s_{22}^{12M} & 1 \\ s_{11}^{13M} & s_{21}^{13M} & s_{12}^{13M} & s_{22}^{13M} & (s_{11}^{13M})^2 & (s_{21}^{13M})^2 & (s_{12}^{13M})^2 & (s_{22}^{13M})^2 & s_{11}^{13M}s_{21}^{13M} & s_{11}^{13M}s_{12}^{13M} & s_{11}^{13M}s_{22}^{13M} & s_{21}^{13M}s_{12}^{13M} & s_{21}^{13M}s_{22}^{13M} & s_{12}^{13M}s_{22}^{13M} & 1 \\ s_{11}^{14M} & s_{21}^{14M} & s_{12}^{14M} & s_{22}^{14M} & (s_{11}^{14M})^2 & (s_{21}^{14M})^2 & (s_{12}^{14M})^2 & (s_{22}^{14M})^2 & s_{11}^{14M}s_{21}^{14M} & s_{11}^{14M}s_{12}^{14M} & s_{11}^{14M}s_{22}^{14M} & s_{21}^{14M}s_{12}^{14M} & s_{21}^{14M}s_{22}^{14M} & s_{12}^{14M}s_{22}^{14M} & 1 \\ s_{11}^{15M} & s_{21}^{15M} & s_{12}^{15M} & s_{22}^{15M} & (s_{11}^{15M})^2 & (s_{21}^{15M})^2 & (s_{12}^{15M})^2 & (s_{22}^{15M})^2 & s_{11}^{15M}s_{21}^{15M} & s_{11}^{15M}s_{12}^{15M} & s_{11}^{15M}s_{22}^{15M} & s_{21}^{15M}s_{12}^{15M} & s_{21}^{15M}s_{22}^{15M} & s_{12}^{15M}s_{22}^{15M} & 1 \end{pmatrix} \begin{pmatrix} d_1 \\ d_2 \\ d_3 \\ d_4 \\ d_5 \\ d_6 \\ d_7 \\ d_8 \\ d_9 \\ d_{10} \\ d_{11} \\ d_{12} \\ d_{13} \\ d_{14} \\ d_0 \end{pmatrix} \quad C1d$$

$S_{11}{}^{P*}$, $S_{21}{}^{P*}$, $S_{12}{}^{P*}$, and $S_{22}{}^{P*}$: the S parameter of the correction-data acquisition samples $11B_{1\ to\ 15}$ measured by the reference measuring system 1

$S_{11}{}^{PM}$, $S_{21}{}^{PM}$, $S_{12}{}^{PM}$, and $S_{22}{}^{PM}$: the S parameter of the correction-data acquisition samples $11B_{1\ to\ 5}$ measured by the actual measuring system 2

[Numerical Formula 7]

$$S_{11}^* = \begin{pmatrix} a_1 & a_2 & a_3 & a_4 & a_5 & a_6 & a_7 & a_8 & a_9 & a_{10} & a_{11} & a_{12} & a_{13} & a_{14} & a_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad \text{C2a}$$

[Numerical Formula 8]

$$S_{21}^* = \begin{pmatrix} b_1 & b_2 & b_3 & b_4 & b_5 & b_6 & b_7 & b_8 & b_9 & b_{10} & b_{11} & b_{12} & b_{13} & b_{14} & b_0 \end{pmatrix} \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad \text{C2b}$$

-continued

[Numerical Formula 9]

$$S_{12}^* = (c_1 \ c_2 \ c_3 \ c_4 \ c_5 \ c_6 \ c_7 \ c_8 \ c_9 \ c_{10} \ c_{11} \ c_{12} \ c_{13} \ c_{14} \ c_0) \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad \text{C2c}$$

[Numerical Formula 10]

$$S_{22}^* = (d_1 \ d_2 \ d_3 \ d_4 \ d_5 \ d_6 \ d_7 \ d_8 \ d_9 \ d_{10} \ d_{11} \ d_{12} \ d_{13} \ d_{14} \ d_0) \begin{pmatrix} S_{11}^M \\ S_{21}^M \\ S_{12}^M \\ S_{22}^M \\ (S_{11}^M)^2 \\ (S_{21}^M)^2 \\ (S_{12}^M)^2 \\ (S_{22}^M)^2 \\ S_{11}^M S_{21}^M \\ S_{11}^M S_{12}^M \\ S_{11}^M S_{22}^M \\ S_{21}^M S_{12}^M \\ S_{21}^M S_{22}^M \\ S_{12}^M S_{22}^M \\ 1 \end{pmatrix} \quad \text{C2d}$$

$S_{11}^*$, $S_{21}^*$, $S_{12}^*$, and $S_{22}^*$: the S parameter of the target electronic component 11A assumed to be obtained by the reference measuring system 1 $S_{11}^M$, $S_{21}^M$, $S_{12}^M$, and $S_{22}^M$: the S parameter of the target electronic component 11A measured by the actual measuring system 2

The interrelation equation computing means 24 determines the undetermined coefficients ($a_q$, $b_q$, $c_q$, and $d_q$: q; integers of 0 to 14) by substituting the measured results (($S_{11}^P$, $S_{21}^P$, $S_{12}^P$, and $S_{22}^P$: p: natural numbers of 1 to 15) in the undetermined-coefficient computing equations (C1a) to (C1d).

The interrelation equation computing means 24 determines the interrelating formulas between the results measured by the actual measuring system 2 and the results measured by the reference measuring system 1 by inserting the identified undetermined coefficients ($a_q$, $b_q$, $c_q$, and $d_q$) into the interrelating formulas (C2a) to (C2d). The interrelating formulas are determined for each frequency point. The determined interrelation equation is input and recorded in the memory 23 by the interrelating formula computing means 24 via the control unit body 22.

After the preliminary process described above, electrical characteristics of the target electronic component 11A are measured by the actual measuring system 2. The measured results (electrical characteristics) of the target electronic component 11A in the actual measuring system 2 are corrected to the electrical characteristics assumed to be obtained by the reference measuring system 1 by substituting the measured electrical characteristics (S parameter) in the interrelating formulas (C2a) to (C2d).

The third embodiment having the same advantage as in the second embodiment further produces the following advantage. That is, even if the actual measuring system 2 includes more complicated errors, the correction is performed in high accuracy. This results from the ability of expressing complicated correlation because each point in two four-dimensional spaces has one-to-one correspondence with a quadratic expression according to the embodiment.

According to the second embodiment, the relative correction method using a linear expression is incorporated in the present invention while according to the third embodiment, the relative correction method using a quadratic approximate expression is incorporated in the present invention. However, the present invention is not limited to these embodiments and a relative correction method using an expression of arbitrary degree n can be of course incorporated in the present invention. The higher the degree of an expression, although the computing time increases because of a complicated configuration, the more correction accuracy is improved.

Moreover, without using an approximate expression of arbitrary degree n, some terms of the equation may be arbitrarily omitted to the extent of allowable reduction in accuracy. For example, when $S_{21} \approx S_{12}$, omitting a term including $S_{21}$ or $S_{12}$ does scarcely affect assumption accuracy. In an electronic component being nondirectional in a signal transmission direction, $S_{21}=S_{12}$. In such a manner, the number of the correction-data acquisition samples is reduced.

Even if a sample has symmetrical electrical characteristics, slightly different values may be measured because of measurement errors. Therefore, an average value of $S_{21}$ and $S_{12}$ may be preferably used.

The correction equations simplified in such a manner become the following equation (D1) and equation (D2). The equation (D1) corresponds to the equation (B1a) and equation (C1a) mentioned above. In the equations (B1b) to (B1d) and equations (C1b) to (C1d), simplifying is similar, so that description thereof is omitted. The equation (D2) corresponds to the equation (B2) and equations (C2a) to (C2d) mentioned above. Undetermined coefficient $S_A^{nM}$ in the equations (D1) and (D2) indicates an average value of $S_{21}^{nM}$ and $S_{12}^{nM}$ (n: natural numbers of 1 to 5).

[Numerical Formula 29]   D1

$$\begin{pmatrix} S_{11}^{1*} \\ S_{11}^{2*} \\ S_{11}^{3*} \\ S_{11}^{4*} \end{pmatrix} = \begin{pmatrix} S_{11}^{1M} & S_A^{1M} & S_{22}^{1M} & 1 \\ S_{11}^{2M} & S_A^{2M} & S_{22}^{2M} & 1 \\ S_{11}^{3M} & S_A^{3M} & S^{3M} & 1 \\ S_{11}^{4M} & S_A^{4M} & S_{22}^{4M} & 1 \end{pmatrix} \begin{pmatrix} a_1 \\ a_2 \\ a_3 \\ a_0 \end{pmatrix}$$

[Numerical Formula 30]   D2

$$S_{11}^* = (a_1 a_2 a_3 a_0) \begin{pmatrix} S_{11}^M \\ S_A^M \\ S_{22}^M \\ 1 \end{pmatrix}$$

Figure 14:
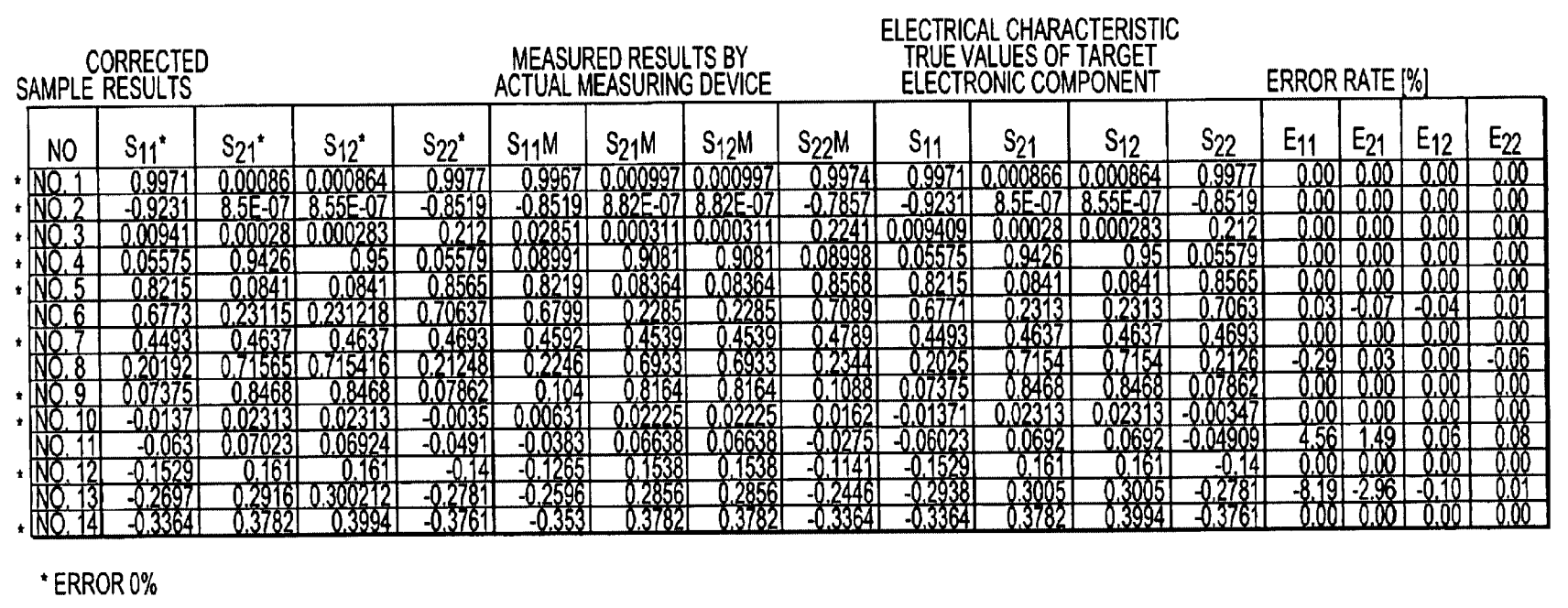

FIG. 13 shows data corrected by the measurement error correction method according to the second embodiment from the result measured by the actual measuring system 2; FIG. 14 shows data corrected by the measurement error correction method according to the third embodiment from the result measured by the actual measuring system 2. From these data, it is confirmed that the value corrected by the measurement error correction method according to the present invention approaches the true value of electrical characteristics of the electronic component.

Figure 15:
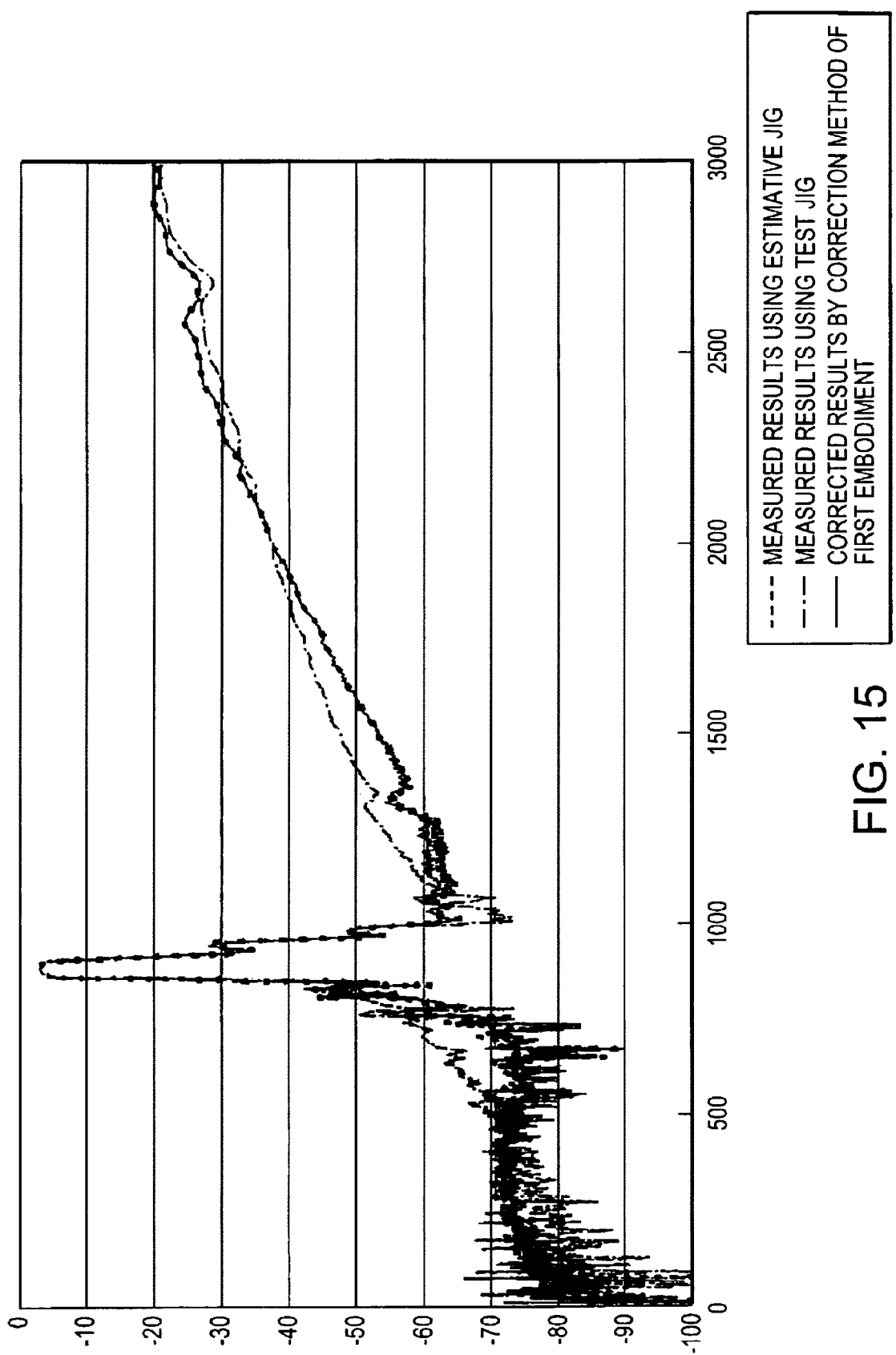
FIG. 15 is a graph showing correction data obtained by performing the measurement error correction method according to the second embodiment of the present invention and actual measured results.
Figure 16:
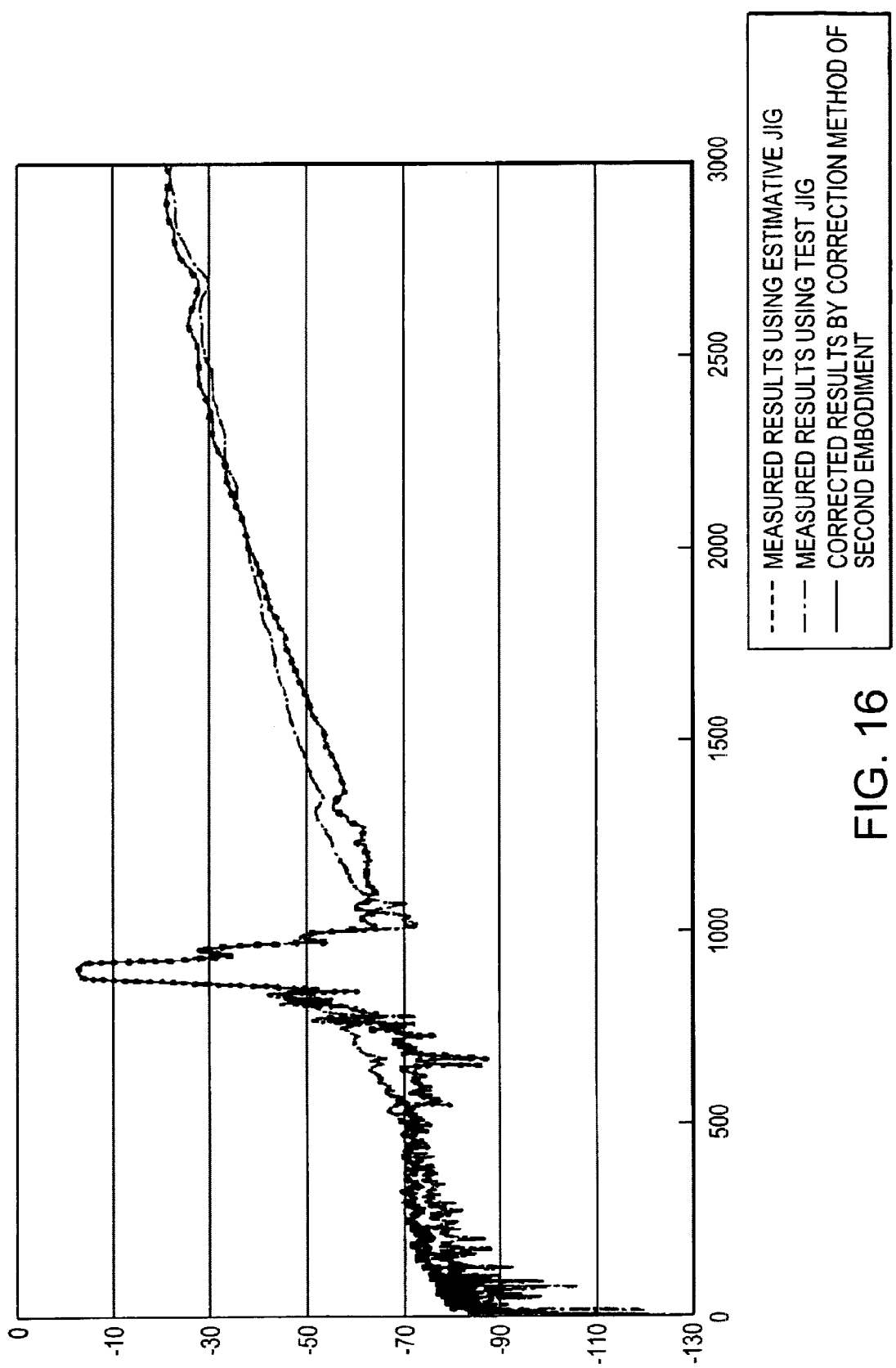
FIG. 16 is a graph showing correction data obtained by performing the measurement error correction method according to the third embodiment of the present invention and actual measured results.

FIGS. 15 and 16 are graphs showing the relationship between the corrected result of the scattering coefficient $S_{21}$, which is one of S parameter, and the actual measured result of $S_{21}$. FIG. 15 shows the relationship between the result corrected by the correction method according to the second embodiment and the actual measured result; FIG. 16 shows the relationship between the result corrected by the correction method according to the third embodiment and the actual measured result.

As shown in FIGS. 15 and 16, it is understood that the result corrected by the correction method according to the second embodiment using the linear expression substantially agrees with the actual measured result; the result corrected by the correction method according to the third embodiment using the quadric expression agrees with the actual measured result more precisely.

The measurement error correction method according to the first to third embodiments may be preferably incorporated in the following quality checking method of electronic components.

The required characteristics set for a target electronic component may be characteristics measured by the reference measuring system. In quality checking such an electronic component based on the result measured by the actual measuring system, which does not agree with the reference measuring system, it is difficult to improve checking accuracy.

In applying the measurement error correction method according to the first to third embodiments to such a quality checking method of electronic components, checking result with high accuracy can be achieved.

Specifically, the electric characteristics of a target electronic component measured by the actual measuring system are corrected by the measurement error correction method according to the first to third embodiments, and then, by comparing between the corrected electric characteristics and the required characteristics, the quality of the target electronic component is determined. By doing so, the corrected electric characteristics are directly comparative with the required characteristics, improving accuracy of the quality checking of a target electronic component.

What is claimed:

1. A measurement-error correction method, in which after electrical characteristics of a target electronic component are measured by an actual measuring system with measured results that do not agree with a reference measuring system, the measured values are corrected to electrical characteristics assumed to be obtained by the reference measuring system, the measurement-error correction method comprising the steps of:

preparing a correction-data acquisition sample in advance, which generates the same electrical characteristics as arbitrary electrical characteristics of the target electronic component;

measuring electrical characteristics of the correction-data acquisition sample by the reference measuring system and the actual measuring system, respectively;

obtaining an interrelating formula between results measured by the reference measuring system and results measured by the actual measuring system; and correcting electrical characteristics of the target electronic component to electrical characteristics assumed to be obtained by the reference measuring system by substituting the electrical characteristics of the target electronic component measured by the actual measuring system in the interrelating formula for computation.

2. A method according to claim 1, wherein the step of obtaining the interrelating formula comprises:

creating a theoretical equation for obtaining a measurement true value of the actual measuring system in the signal transfer pattern and a theoretical equation for obtaining a measurement true value of the reference measuring system in the signal transfer pattern, respectively;

creating the interrelating formula comprising an arithmetic expression, which includes an undetermined coefficient and directly and exclusively shows the relationship between the measurement true value of the actual measuring system and the measurement true value of the reference measuring system, based on both the theoretical equations;

measuring electrical characteristics of the correction-data acquisition sample by the reference measuring system and the actual measuring system, respectively; and identifying the undetermined coefficient by substituting the electrical characteristics of the correction-data acquisition sample measured by both the measuring systems in the interrelating formula.

3. A method according to claim 2, wherein a plurality of samples having electrical characteristics which are different from each other as measured by the measuring system are used as the correction-data acquisition sample.

4. A method according to claim 3, wherein the electrical characteristics which of the target electronic component are S parameter characteristics, and wherein the step of measuring includes measuring with a network analyzer.

5. A method according to claim 1, wherein the step of obtaining the interrelating formula comprises the procedures of:

creating the interrelating formula comprising an expression of degree n (n is a natural number), which includes an undetermined coefficient and approximately shows the relationship between the value measured by the actual measuring system and the value measured by the reference measuring system;

measuring electrical characteristics of the correction-data acquisition sample by the reference measuring system and the actual measuring system, respectively; and identifying the undetermined coefficient by creating an undetermined-coefficient computing equation based on the interrelating formula so as to substitute the electrical characteristics of the correction-data acquisition sample measured by both the measuring systems in the undetermined-coefficient computing equation.

6. A method according to claim 5, wherein a plurality of samples having electrical characteristics which are different from each as measured by the measuring system are used as the correction-data acquisition sample.

7. A method according to claim 6, wherein the electrical characteristics of the target electronic component are S parameter, and wherein the step of measuring includes measuring with network analyzer.

8. A method according to claim 1, wherein a plurality of samples having electrical characteristics which are different from each other as measured by the measuring system are used as the correction-data acquisition sample.

9. A method according to claim 8, wherein the electrical characteristics of the target electronic component S parameter characteristics, and wherein the step of measuring includes measuring with an network analyzer.

10. A quality checking method of electronic components, in which a target electronic component with required electrical characteristics to be measured by a reference measuring system is measured by an actual measuring system with measured results, which do not agree with the measured results from the reference measuring system, the quality checking method comprising the steps of:

correcting the electrical characteristics of the target electronic component measured by the actual measuring system using a measurement-error correction method according to any one of claims 1 to 9; and checking quality of the target electronic component by comparing the corrected electrical characteristics with the required electrical characteristics.

11. A measuring system for measuring electronic component characteristics comprising:

target electronic component measuring means for measuring electrical characteristics of a target electronic component;

storing means for storing electrical characteristics, which are measured by the reference measuring system, of a correction-data acquisition sample generating the same electrical characteristics as arbitrary electrical characteristics of the target electronic component;

interrelating formula computing means for computing an interrelating formula between the electrical characteristics of the correction-data acquisition sample, which are measured by the measuring means, and the electrical characteristics of the correction-data acquisition sample, which are measured by the reference measuring system and stored in the storing means; and correcting means for correcting the electrical characteristics of the target electronic component to electrical characteristics assumed to be obtained by the reference measuring system by substituting the electrical characteristics of the target electronic component measured by the measuring means in the interrelating formula for computation.

12. A measuring system according to claim 11, wherein the interrelating formula computing means comprises:

theoretical equation creating means for creating a theoretical equation for obtaining a measurement true value of the actual measuring system in the signal transfer pattern and creating a theoretical equation for obtaining a measurement true value of the reference measuring system in the signal transfer pattern;

interrelating formula creating means for creating the interrelating formula comprising an arithmetic expression, which include an undetermined coefficient and directly and exclusively shows the relationship between the measurement true value of the actual measuring system and the measurement true value of the reference measuring system, based on both the theoretical equations;

correct data acquisition measuring means for measuring electrical characteristics of the correction-data acquisition sample by the reference measuring system and the actual measuring system, respectively; and identifying means for identifying the undetermined coefficient by substituting the electrical characteristics of the correction-data acquisition sample measured by both the measuring systems in the interrelating formula.

13. A measuring system according to claim 11, wherein the interrelating formula computing means comprises:

creating means for creating the interrelating formula comprising an expression of degree n (n is a natural number), which includes an undetermined coefficient and approximately shows the relationship between the value measured by the actual measuring system and the value measured by the reference measuring system;

correction data acquisition measuring means for measuring electrical characteristics of the correction-data acquisition sample by the reference measuring system and the actual measuring system, respectively; and identifying means for identifying the undetermined coefficient by substituting the electrical characteristics of the correction-data acquisition sample measured by the reference measuring system in the interrelating formula.

* * * * *